(12) United States Patent
Si et al.

(10) Patent No.: US 10,476,526 B2
(45) Date of Patent: *Nov. 12, 2019

(54) CODING AND DECODING METHOD AND DEVICE, AND SYSTEM

(71) Applicant: Huawei Technologies Co., Ltd., Shenzhen (CN)

(72) Inventors: Xiaoshu Si, Wuhan (CN); Dao Pan, Johannesburg (ZA); Fanglin Sun, Shenzhen (CN); Xiaofeng Zhang, Shenzhen (CN); Tao Ouyang, Wuhan (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/990,180

(22) Filed: May 25, 2018

(65) Prior Publication Data

US 2018/0278270 A1    Sep. 27, 2018

Related U.S. Application Data

(63) Continuation of application No. 14/864,338, filed on Sep. 24, 2015, now Pat. No. 10,014,880, which is a
(Continued)

(51) Int. Cl.
*H03M 13/17* (2006.01)
*H03M 13/00* (2006.01)
(Continued)

(52) U.S. Cl.
CPC ....... *H03M 13/17* (2013.01); *H03M 13/1102* (2013.01); *H03M 13/35* (2013.01);
(Continued)

(58) Field of Classification Search
CPC .... H03M 13/17; H03M 13/618; H03M 13/35; H03M 13/611; H03M 13/6516;
(Continued)

(56) References Cited

U.S. PATENT DOCUMENTS 7,263,651 B2 *  8/2007  Xia ................... H03M 13/1114
                                                    714/774
7,451,381 B2   11/2008  Miller et al.
(Continued)

FOREIGN PATENT DOCUMENTS

CN     101312349 A    11/2008
CN     101494517 A     7/2009
(Continued)

OTHER PUBLICATIONS

"IEEE Standard for Information technology—Telecommunications and information exchange between systems—Local and Metropolitan area networks—Specific requirements, Part 11: Wireless LAN Medium Access Control (MAC) and Physical Layer (PHY) Specifications Amendment 5: Enhancements for Higher Throughput," IEEE Std 802.11n, Institute of Electrical and Electronics Engineers, New York, New York (2009).
(Continued)

*Primary Examiner* — Cynthia Britt
(74) *Attorney, Agent, or Firm* — Leydig, Voit & Mayer, Ltd.

(57) ABSTRACT

Embodiments of the present disclosure provide an FEC coding and decoding method and device, and a system. A transmit end determines a forward error correction FEC coding type according to a length of to-be-coded data in burst data, and performs coding according to the determined FEC coding type. A receive end determines a forward error correction FEC decoding type according to a length of to-be-decoded data in burst data, and performs decoding
(Continued)

according to the determined FEC decoding type. The FEC coding and decoding method provided in the embodiments of the present disclosure improves utilization of a communication resource is improved, and saves a communication resource.

21 Claims, 11 Drawing Sheets

Related U.S. Application Data continuation of application No. PCT/CN2013/075277, filed on May 7, 2013.

(51) Int. Cl.
*H04L 1/00* (2006.01)
*H03M 13/11* (2006.01)
*H03M 13/35* (2006.01)
*H03M 13/15* (2006.01)
*H03M 13/23* (2006.01)
*H03M 13/29* (2006.01)

(52) U.S. Cl.
CPC ....... *H03M 13/353* (2013.01); *H03M 13/611* (2013.01); *H03M 13/618* (2013.01); *H03M 13/6516* (2013.01); *H04L 1/0041* (2013.01); *H04L 1/0046* (2013.01); *H04L 1/0075* (2013.01); *H03M 13/1515* (2013.01); *H03M 13/23* (2013.01); *H03M 13/2957* (2013.01)

(58) Field of Classification Search
CPC ........... H03M 13/353; H03M 13/1102; H03M 13/1515; H03M 13/2957; H03M 13/23; H04L 1/0046; H04L 1/0041; H04L 1/0075; H04L 1/0032
See application file for complete search history.

(56) References Cited

U.S. PATENT DOCUMENTS

| 8,271,849 | B2 | 9/2012 | Limberg |
| 2007/0143654 | A1 | 6/2007 | Joyce et al. |
| 2007/0297451 | A1 | 12/2007 | Kim et al. |
| 2008/0028274 | A1 | 1/2008 | Lin |
| 2008/0168332 | A1 | 7/2008 | Palanki et al. |
| 2008/0178065 | A1 | 7/2008 | Khandekar et al. |
| 2009/0282314 | A1 | 11/2009 | Djordjevic et al. |
| 2010/0251082 | A1 | 9/2010 | Cheng et al. |
| 2011/0154161 | A1 | 6/2011 | Kim et al. |
| 2011/0173516 | A1 | 7/2011 | Geng et al. |
| 2012/0089890 | A1 | 4/2012 | Palanki et al. |
| 2012/0198307 | A1 | 8/2012 | Kibe |
| 2014/0258802 | A1 | 9/2014 | Randhawa et al. |
| 2015/0326350 | A1 | 11/2015 | Macikunas et al. |

FOREIGN PATENT DOCUMENTS

| CN | 102239652 A | 11/2011 |
| CN | 103004123 A | 3/2013 |
| EP | 2088707 A1 | 8/2009 |
| JP | H10285147 A | 10/1998 |
| RU | 2427086 C2 | 8/2011 |
| RU | 2443053 C2 | 2/2012 |
| WO | 2008034292 A1 | 3/2008 |
| WO | 2009053825 A2 | 4/2009 |

OTHER PUBLICATIONS

"IEEE Standard for Local and metropolitan area networks, Part 16: Air Interface for Fixed Broadband Wireless Access Systems," IEEE Std 802.16, Institute of Electrical and Electronics Engineers, New York, New York (2004).

"EPOC Upstream FEC Code Auto-Detection," XP068058297,www.huawei.com vol. 802.3bn, Huawei Technologies Co., Ltd., (2013).

* cited by examiner

CODING AND DECODING METHOD AND DEVICE, AND SYSTEM

CROSS-REFERENCE TO RELATED APPLICATIONS

This application is a continuation of U.S. patent application Ser. No. 14/864,338, filed on Sep. 24, 2015, which is a continuation of International Patent Application No. PCT/CN2013/075277, filed on May 7, 2013. All of the aforementioned patent applications are hereby incorporated by reference in their entireties.

TECHNICAL FIELD

The present disclosure relates to the field of communications technologies, and more specifically, to a coding and decoding method and device, and a system.

BACKGROUND

Over the last few decades, coaxial cables have been widely deployed around the world. However, it is difficult for conventional cable access technology to meet a future requirement of a user.

A coaxial distribution network based on the Ethernet passive optical network (EPON) protocol (EPON Protocol over Coaxial Distribution Network, EPoC) is a next-generation hybrid fiber coaxial (HFC) access technology that can be applicable to various application scenarios (including an optical fiber section and a coaxial section) of a cable television network. The EPoC transplants a Media Access Control (MAC) layer protocol of the EPON to the coaxial section of the cable television network, and defines a physical layer based on orthogonal frequency division multiplexing (OFDM).

An EPON system and an EPoC system generally use a forward error correction (FEC) method to reduce a bit error rate of information transmission. A corresponding FEC parameter is also generated when the FEC method is used to reduce the bit error rate. Generally, a receive end can correctly perform decoding on received service data according to a corresponding FEC parameter only after receiving the corresponding FEC parameter sent by a transmit end, and transfer of the FEC parameter inevitably needs to occupy a corresponding spectrum resource.

SUMMARY

In view of this, embodiments of the present disclosure provide a burst data coding method, a decoding method and a device, and a system, and according to the provided method, device, and system, correct data transmission can be implemented without a need to transfer an FEC parameter.

According to a first aspect, a burst data coding method is provided, including: determining an FEC coding type according to a length of to-be-coded data in burst data and a correspondence between a data length and a forward error correction FEC coding type, where there are at least two different data length ranges that are respectively corresponding to two different FEC coding types; and performing coding according to the determined FEC coding type.

With reference to the first aspect, in a first possible implementation manner, an FEC coding type may be determined according to a data length range to which the length of the to-be-coded data in the burst data belongs and a correspondence between a corresponding data length range and a corresponding FEC coding type; and coding is performed on the entire burst data by using the determined FEC coding type.

With reference to the first aspect, in a second possible implementation manner, an FEC coding type may be determined according to a data length range to which the length of the to-be-coded data in the burst data belongs and a correspondence between a corresponding data length range and a corresponding FEC coding type; one-codeword FEC coding is performed by using the determined FEC coding type; a length of remaining to-be-coded data continues to be determined after the one-codeword FEC coding is performed, and coding is performed according to the determining; and the foregoing steps are repeated until coding is complete.

With reference to the first aspect, in a third possible implementation manner, the coding method further includes: determining a length of the burst data, where the length of the burst data herein may be determined by means of bandwidth authorization; the determining an FEC coding type according to a length of to-be-coded data in the burst data and a correspondence between a data length and a forward error correction FEC coding type specifically includes: determining, according to the length of the burst data and the correspondence between a data length and an FEC coding type, an FEC coding type or an FEC coding type sequence corresponding to the length of the burst data; and the performing coding according to the determined FEC coding type specifically includes: performing coding according to the determined FEC coding type or FEC coding type sequence.

According to a second aspect, a burst data decoding method is provided, which may be used to perform decoding on burst data formed by performing coding by using the coding method in the first aspect, and the method includes: determining an FEC decoding type according to a length of to-be-decoded data in the burst data and a correspondence between a data length and a forward error correction FEC decoding type; and performing decoding according to the determined FEC decoding type, where there are at least two different data length ranges that are respectively corresponding to two different FEC decoding types; the to-be-decoded data is obtained by coding by using an FEC coding type; a length of the to-be-decoded data obtained after coding is corresponding to the FEC coding type; and the determined FEC decoding type is corresponding to the FEC coding type.

With reference to the second aspect, in a first possible implementation manner, an FEC decoding type may be determined according to a data length range to which the length of the to-be-decoded data in the burst data belongs and a correspondence between a corresponding data length range and a corresponding FEC decoding type; and decoding is performed on the entire burst data by using the determined FEC decoding type.

With reference to the second aspect, in a second possible implementation manner, an FEC decoding type may be determined according to a data length range to which the length of the to-be-decoded data in the burst data belongs and a correspondence between a corresponding data length range and a corresponding FEC decoding type; one-codeword FEC decoding is performed by using the determined FEC decoding type; a length of remaining to-be-decoded data continues to be determined after the one-codeword FEC decoding is performed, and decoding is performed according to the determining; and the foregoing steps are repeated until decoding is complete.

With reference to the second aspect, in a third aspect, the decoding method further includes: determining a length of the burst data; the determining a forward error correction FEC decoding type according to a length of to-be-decoded data in the burst data specifically includes: determining, according to the length of the burst data and the correspondence between a data length and an FEC decoding type, an FEC decoding type or FEC decoding type sequence corresponding to the length of the burst data; and the performing decoding according to the determined FEC decoding type specifically includes: performing decoding according to the determined FEC decoding type or FEC decoding type sequence.

According to a third aspect, a burst data coding device is provided, and the coding device includes: an FEC coding type determining module, configured to determine an FEC coding type according to a length of to-be-coded data in burst data and a correspondence between a data length and a forward error correction FEC coding type, where there are at least two different data length ranges that are respectively corresponding to two different FEC coding types; and a coding module, configured to perform coding according to the FEC coding type determined by the FEC coding type determining module.

With reference to the third aspect, in a first possible implementation manner, the FEC coding type determining module may determine an FEC coding type according to a data length range to which the length of the to-be-coded data in the burst data belongs and a correspondence between a corresponding data length range and a corresponding FEC coding type; and the coding module performs coding on the entire burst data by using the determined FEC coding type.

With reference to the third aspect, in a second possible implementation manner, the FEC coding type determining module may determine an FEC coding type according to a data length range to which the length of the to-be-coded data in the burst data belongs and a correspondence between a corresponding data length range and a corresponding FEC coding type; the coding module performs one-codeword FEC coding by using the determined FEC coding type; the FEC coding type determining module continues, to determine a length of remaining to-be-coded data after the one-codeword FEC coding is performed; the coding module performs coding according to the determining; and the foregoing steps are repeated until coding is complete.

With reference to the third aspect, in a third possible implementation manner, the FEC coding type determining module determines, according to a length of the burst data and the correspondence between a data length and an FEC coding type, an FEC coding type or an FEC coding type sequence corresponding to the length of the burst data; and the coding module performs coding according to the determined FEC coding type or FEC coding type sequence.

According to a fourth aspect, a burst data decoding device is provided, including: an FEC decoding type determining module, configured to determine an FEC decoding type according to a length of to-be-decoded data in burst data and a correspondence between a data length and a forward error correction FEC decoding type, where there are at least two different data length ranges that are respectively corresponding to two different FEC decoding types; the to-be-decoded data is obtained by coding by using an FEC coding type; a length of the to-be-decoded data obtained after coding is corresponding to the FEC coding type; and the determined FEC decoding type is corresponding to the FEC coding type; and a decoding module, configured to perform decoding according to the FEC decoding type determined by the FEC decoding type determining module.

With reference to the fourth aspect, in a first possible implementation manner, the FEC decoding type determining module may determine an FEC decoding type according to a data length range to which the length of the to-be-decoded data in the burst data belongs and a correspondence between a corresponding data length range and a corresponding FEC decoding type; and the decoding module performs decoding on the entire burst data by using the determined FEC decoding type.

With reference to the fourth aspect, in a second possible implementation manner, the FEC decoding type determining module may determine an FEC decoding type according to a data length range to which the length of the to-be-decoded data in the burst data belongs and a correspondence between a corresponding data length range and a corresponding FEC decoding type; the decoding module performs one-codeword FEC decoding by using the determined FEC decoding type; the FEC decoding type determining module continues to determine a length of remaining to-be-decoded data after the one-codeword FEC decoding is performed; the decoding module performs decoding according to the determining; and the foregoing steps are repeated until decoding is complete.

With reference to the fourth aspect, in a third possible implementation manner, the FEC decoding type determining module determines, according to a length of the burst data and the correspondence between a data length and an FEC decoding type, an FEC decoding type or FEC decoding type sequence corresponding to the length of the burst data; and the decoding module performs decoding according to the determined FEC decoding type or FEC decoding type sequence.

According to a fifth aspect, a communications system is provided, including the coding device introduced in the third aspect and the decoding device introduced in the fourth aspect, which cooperate with each other by using the coding method provided in the first aspect and the decoding method provided in the second aspect, so as to implement communication.

According to the coding and decoding method and device, and the system that are provided in the embodiments of the present disclosure, a forward error correction FEC coding type is determined according to a length of to-be-coded data in burst data and a correspondence between a data length and a forward error correction FEC coding type, and coding is performed according to the determined FEC coding type. A forward error correction FEC decoding type is determined according to a length of received to-be-decoded data and a correspondence between a data length and a forward error correction FEC decoding type, and decoding is performed according to the determined FEC decoding type, so that different FEC coding and decoding types can be supported. Compared with a single FEC coding and decoding type, a coding and decoding type is flexibly selected according to the data length, thereby reducing a parity bit that needs to be sent, reducing redundancy, and improving utilization of a communication resource. In addition, because a transmit end and a receive end independently select an FEC coding and decoding type according to the data length, a corresponding FEC parameter does not need to be transmitted, thereby reducing a communication resource.

BRIEF DESCRIPTION OF DRAWINGS

To describe the technical solutions in the embodiments of the present disclosure or in the prior art more clearly, the following briefly introduces the accompanying drawings required for describing the embodiments or the prior art. Apparently, the accompanying drawings in the following description show some embodiments of the present disclosure, and a person of ordinary skill in the art may still derive other drawings from these accompanying drawings without creative efforts.

DESCRIPTION OF EMBODIMENTS

To make the objectives, technical solutions, and advantages of the embodiments of the present disclosure clearer, the following clearly describes the technical solutions in the embodiments of the present disclosure with reference to the accompanying drawings in the embodiments of the present disclosure. Apparently, the described embodiments are some but not all of the embodiments of the present disclosure. All other embodiments obtained by a person of ordinary skill in the art based on the embodiments of the present disclosure without creative efforts shall fall within the protection scope of the present disclosure.

Figure 1:
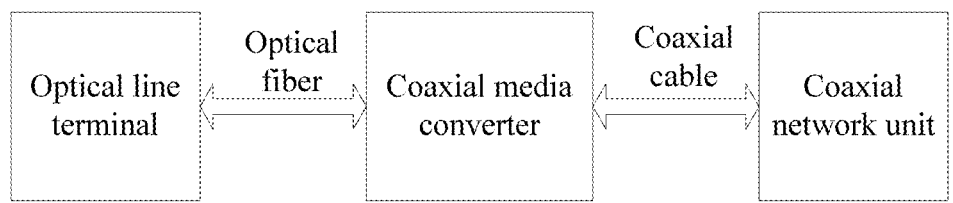
FIG. 1 is a diagram of a network structure of an EPoC system in the prior art.

FIG. 1 is a diagram of a network structure of an EPoC system. As shown in the diagram, an optical line terminal (OLT) is connected to a coaxial media converter (CMC) by using an optical fiber, the CMC is connected to a coaxial network unit (CNU) by using a coaxial cable (coax). The OLT is connected to a transport network (not shown in the diagram) so as to implement interworking with a network side. The CNU is connected to a user terminal device (not shown in the diagram) so as to finally implement access by a user. A person of ordinary skill in the art may understand that FIG. 1 is only an example. During actual networking, one OLT may be connected to multiple CNUs by using a coaxial splitter, or may be connected to multiple optical network units (ONU) by using an optical distribution node (ODN), or may further be simultaneously connected to multiple CNUs and multiple ONUs in a hybrid manner.

As shown in FIG. 1, in the EPoC system, the OLT and the CMC are connected by using the optical fiber, and in between, a corresponding ODN, an optical amplifier, or another relay device (not shown in the diagram) may exist. The CMC and the CNU are connected by using the coaxial cable, and in between, a relay device (not shown in the diagram), such as a coaxial splitter or an amplifier may exist. In this system, in a downstream direction, data is sent in a broadcast manner, an optical signal sent by the OLT is converted into an electrical signal by using the CMC and is broadcasted to all connected CNUs, and a CNU selects service data of itself, and discards data of other CNUs or ONUs; in an upstream direction, a burst mode is used, each CNU sends data to the CMC in a pre-allocated time-frequency resource block, and the CMC performs combination, converts the data into an optical signal and transmits the optical signal upwards to the OLT.

Methods, devices, and systems that are provided in all embodiments of the present disclosure may be applied to the system shown in FIG. 1, and are used for sending burst data in the upstream direction. It should be understood that a method, a device, and a system that are provided in all embodiments of the present disclosure may be applied to another scenario in which data is sent by using the burst mode, or may be applied to a scenario in which data is sent by using a continuous mode; and FIG. 1 shall not be construed as a limitation to the present disclosure.

Figure 2:
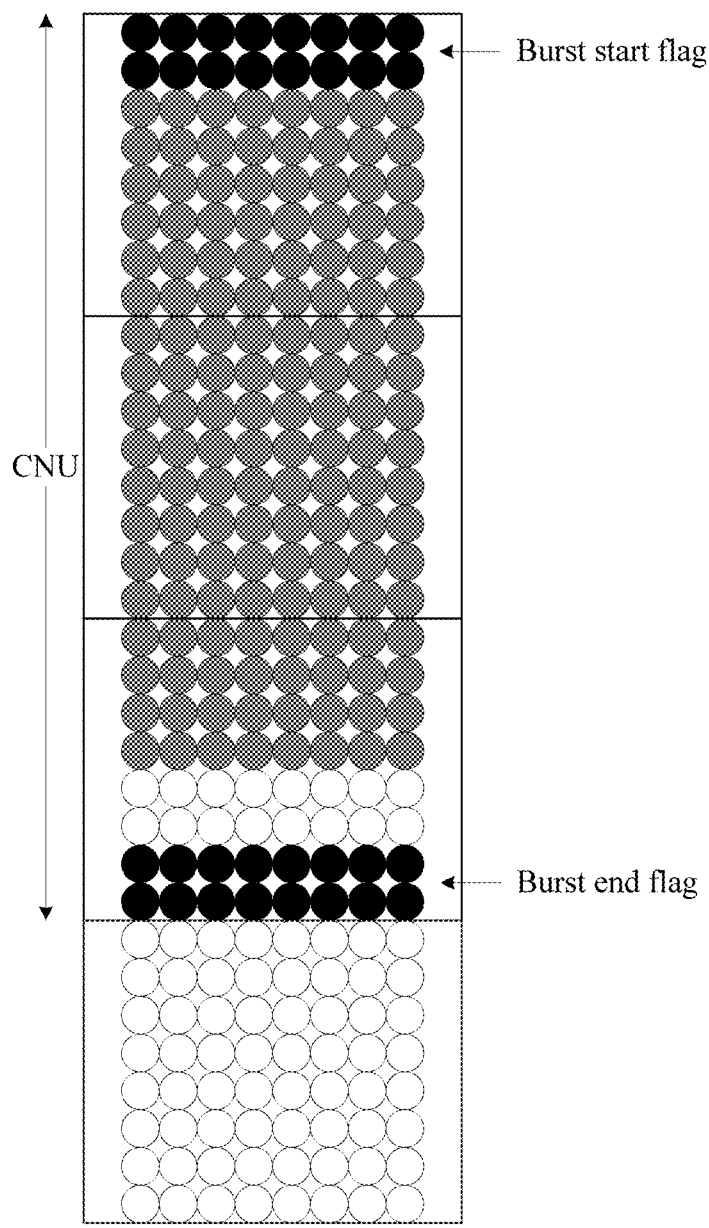
FIG. 2 is a schematic diagram of a structure of a time-frequency resource block.

FIG. 2 describes a resource usage condition, in an upstream, of a CNU in the burst mode. A horizontal axis represents time, and a vertical axis represents a frequency. The diagram represents that there are four available time-frequency resource blocks (RB) in the upstream, and an RB is a smallest scheduling granularity (that is, resources occupied by one CNU is an integer multiple of the RB) in the system. As shown in FIG. 2, the CNU occupies three RBs (the last RB is not fully occupied) of the four available time-frequency resource blocks. FIG. 2 is only an example. In fact, a quantity of RBs occupied by the CNU may vary with an amount of data that needs to be transmitted, for example, four, five, or more RBs may be occupied. In FIG. 2, the CNU occupies but does not fully occupy resources of the three RBs. However, three complete RBs are needed during data transmission, and a part that is not fully filled may be filled with zero or another set value.

At a transmit end, that is, specifically the CNU in FIG. 1, in order that the CMC can learn a start location of burst data of the CNU when receiving the burst data, a burst start flag is inserted at the start location of the burst data, and a burst end flag is inserted at an end location of the burst data, that is, corresponding small black dots in FIG. 2. At a receive end, a start point and an end point of burst data of each CNU can be obtained by detecting corresponding flags.

The burst data is carried in a corresponding RB, and is more or less affected by noise during transmission, and as a result a bit error rate is increased. To enhance an anti-noise capability of the system and reduce the bit error rate during transmission, a feasible method is as follows: performing coding on original burst data in a forward error correction (FEC) manner, and generating parity information, so that the receive end can restore the original burst data by using the parity information. FEC coding has a correction capability. When performing decoding, the receive end can not only discover an error, but also determine a location of an error element and perform automatic correction. Information about error element correction does not need to be stored or fed back, and real-time quality is good.

Figure 3:
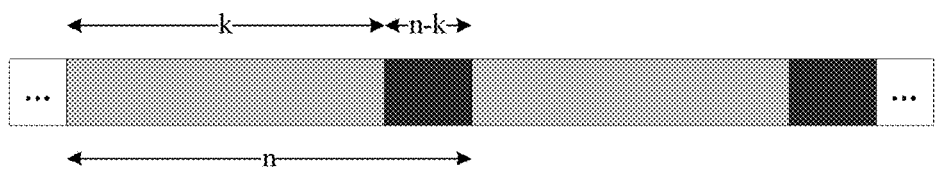
FIG. 3 is a schematic diagram of a structure of a codeword formed by performing FEC coding.
Figure 4:
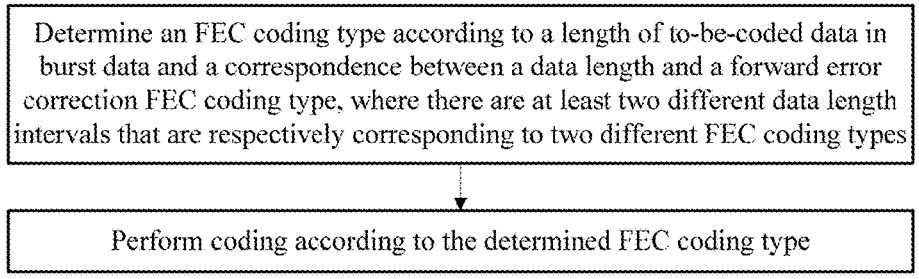
FIG. 4 is a flowchart of a coding method according to Embodiment 1 of the present disclosure.

There are multiple FEC coding types, such as low-density parity-check (LDPC) code, Reed-Solomon (RS) code, and convolution code (CC). A same FEC coding type may have different code lengths according to different code rates. For example, the LDPC coding includes coding types of at least three code lengths, which are respectively LDPC coding of a 16200-bit code length, LDPC coding of a 5940-bit code length, and LDPC coding of a 1120-bit code length. As shown in FIG. 3, an FEC coding type may be identified by using (n, k), where k is a length of an information bit that is also referred to as an information bit length, and is used to indicate a length of data carried in one codeword formed by performing coding; and a codeword length n indicates a total length of one codeword. Accordingly, n-k is used to indicate a length of a parity bit in one codeword, and a corresponding code rate may be indicated by using r=k/n. In all embodiments of the present disclosure, a length may be used to indicate an information bit length, a code length of a codeword, and a length of a parity bit, and specifically refers to a quantity of bits of data carried in the corresponding codeword, a total quantity of bits of the codeword, and a quantity of bits of the parity bit of the codeword.

In Embodiment 1, this embodiment of the present disclosure provides a burst data coding and decoding method and a system, which can be applied to a scenario in which communication is performed by using a burst mode. Preferably, the method may be applied to an EPoC system shown in FIG. 1. Specifically, a CNU in FIG. 1 may perform, by using the coding method in this embodiment of the present disclosure, FEC coding on data that needs to be sent in an upstream, and a CMC may perform, by using the decoding method in this embodiment of the present disclosure, FEC decoding on burst data that comes from the CNU and on which FEC coding is performed. In FIG. 1, a combination of the CNU and the CMC may constitute a simplest example of the system in this embodiment of the present disclosure.

This embodiment of the present disclosure provides a burst data coding method that can be used by a transmit end, and the method includes: determining an FEC coding type according to a length of to-be-coded data in burst data and a correspondence between a data length and a forward error correction FEC coding type, where there are at least two different data length ranges that are respectively corresponding to two different FEC coding types; and performing coding according to the determined FEC coding type.

Optionally, the determining an FEC coding type according to a length of to-be-coded data in burst data and a correspondence between a data length and a forward error correction FEC coding type and the performing coding according to the determined FEC coding type specifically include: when $L_1 > K_1$, determining the first FEC coding type corresponding to $K_1$, and performing coding on the burst data by using the first FEC coding type, where $L_1$ is the length of the to-be-coded data, and $K_1$ is a threshold corresponding to the first FEC coding type; or when $K_{p-1} \geq L_1 > K_p$, determining the $p^{th}$ FEC coding type corresponding to $K_p$, performing coding on the burst data by using the $p^{th}$ FEC coding type, where $K_p$ is a threshold corresponding to the $p^{th}$ FEC coding type, and $K_{p-1}$ is a threshold corresponding to the $p-1^{th}$ FEC coding type; or when $L_1 \leq K_m$, determining the $m^{th}$ FEC coding type corresponding to $K_m$, and performing coding on the burst data by using the $m^{th}$ FEC coding type, where $K_m$ is a threshold corresponding to the $m^{th}$ FEC coding type, where m is an integer greater than or equal to 2, p is any integer in a range that is from 2 to m and that includes 2 and m, and $K_{p-1} > K_p$.

Optionally, the determining an FEC coding type according to a length of to-be-coded data in burst data and a correspondence between a data length and a forward error correction FEC coding type and the performing coding according to the determined FEC coding type specifically include: when the length of the to-be-coded data in the burst data is greater than $K_1$, determining the first FEC coding type corresponding to $K_1$, and performing one-codeword coding by using the first FEC coding type, where $K_1$ is a threshold corresponding to the first FEC coding type; or when the length of the to-be-coded data in the burst data is less than or equal to $K_{p-1}$ and is greater than $K_p$, determining the $p^{th}$ FEC coding type corresponding to $K_p$, and performing one-codeword coding by using the $p^{th}$ FEC coding type, where $K_p$ is a threshold corresponding to the $p^{th}$ FEC coding type, and $K_{p-1}$ is a threshold corresponding to the $p-1^{th}$ FEC coding type; or when the length of the to-be-coded data in the burst data is less than or equal to $K_m$ and is greater than 0, determining the $m^{th}$ FEC coding type corresponding to $K_m$, and performing coding on the to-be-coded data in the burst data by using the $m^{th}$ FEC coding type, or performing one-codeword coding by using the $m^{th}$ FEC coding type, where $K_m$ is a threshold corresponding to the $m^{th}$ FEC coding type, where m is an integer greater than or equal to 2, p is any integer in a range that is from 2 to m and that includes 2 and m, and $K_{p-1} > K_p$.

Optionally, the threshold $K_1$ corresponding to the first FEC coding type, the threshold $K_{p-1}$ corresponding to the $p-1^{th}$ FEC coding type, the threshold $K_p$ corresponding to the $p^{th}$ FEC coding type, and the threshold $K_m$ corresponding to the $m^{th}$ FEC coding type are determined by using a principle that a total length of a parity bit included in data formed by performing coding on the burst data is the shortest.

Specifically, $K_1$ may be equal to a value obtained by multiplying $k_2$ by an integer part of a quotient obtained by dividing $t_1$ by $t_2$; $K_{p-1}$ may be equal to a value obtained by multiplying $k_p$ by an integer part of a quotient obtained by dividing $t_{p-1}$ by $t_p$; $K_p$ may be equal to a value obtained by multiplying $k_{p+1}$ by an integer part of a quotient obtained by dividing $t_p$ by $t_{p+1}$; and $K_m$ may be equal to a value obtained by multiplying $k_m$ by an integer part of a quotient obtained by dividing $t_{m-1}$ by $t_m$, where $t_1$, $t_2$, $t_{p-1}$, $t_p$, $t_{m-1}$, and $t_m$ are respectively lengths of one-codeword parity bits of the first FEC coding type, the second FEC coding type, the $p-1^{th}$ FEC coding type, the $p^{th}$ FEC coding type, the $m-1^{th}$ FEC coding type, and the $m^{th}$ FEC coding type; and $k_2$, $k_p$, $k_{p+1}$, and $k_m$ are respectively lengths of one-codeword information bits of the second FEC coding type, the $p^{th}$ FEC coding type, the $p+1^{th}$ FEC coding type, and the $m^{th}$ FEC coding type.

Optionally, the coding method further includes: determining a length of the burst data, and determining, according to the length of the burst data and the correspondence between a data length and an FEC coding type, an FEC coding type or an FEC coding type sequence corresponding to the length of the burst data; and the performing coding according to the determined FEC coding type specifically includes: performing coding according to the determined FEC coding type or FEC coding type sequence.

The following gives a detailed description of solutions in this embodiment of the present disclosure with reference to specific scenarios.

First, the FEC coding type is determined according to the length of to-be-coded data in the burst data and the correspondence between a data length and a forward error correction FEC coding type.

Because burst data is comparatively independently sent, burst data sent each time is also independent. For example, in the EPoC system, data sent from a CNU to a CMC includes pieces of burst data, and a start and an end of the burst data have a corresponding flag. It should be noted that, as shown in FIG. 2, the burst data herein not only includes corresponding service data (gray dots in FIG. 2) that needs to be transmitted, but also includes a part (white dots in the third RB in FIG. 2) that is not fully filled in an RB. For another example, in the EPoC system, data sent from the CMC to an OLT, and in a system such as a conventional EPON system and GPON system, data sent from an ONU to an OLT also includes pieces of burst data. For another example, in a radio communications system, when data is transmitted by using a burst mode, the transmitted data also includes pieces of burst data. An FEC coding process of burst data that is comparatively independently transmitted is also independent. In this embodiment, to-be-sent burst data, burst data that is sent after coding is performed, and burst data received by a receive end may all be referred to as burst data. In this embodiment of the present disclosure, for a coding device at the transmit end, the burst data refers to the to-be-sent burst data; and for a decoding device at the receive end, the burst data refers to the received burst data. When performing coding, the transmit end marks a start location and an end location of data received within a unit of time. The receive end identifies, by using corresponding flags, burst data on which coding is performed by the transmit end.

The to-be-coded data in the burst data may refer to the entire burst data, or may refer to remaining to-be-coded data in the burst data. It may be understood that, when coding starts to be performed, the entire burst data is not coded, and therefore, the entire burst data is the to-be-coded data. The burst data may need to be divided into multiple codewords so as to be coded, so that in a coding process, a case in which coding of a part of the burst data is already completed, and a remaining part of data still waits to be coded inevitably occurs. Certainly, when an amount of the burst data is relatively small, in a case in which coding may be completed by using one codeword, the to-be-coded data refers to the burst data.

In a relatively mature communications technology, a length of burst data may be determined, that is, a coding device may know a length of burst data that needs to be coded. The EPoC system is used as an example. Before the transmit end performs coding, the coding device at the transmit end knows a size of corresponding burst data that needs to be coded. Specifically, before sending the burst data once, the transmit end may send, to the CMC or OLT, a report (Report) message carrying upstream bandwidth information required by the transmit end. The CMC or OLT may reply a gating (Gate) message carrying corresponding bandwidth authorization information. The transmit end may know a size of to-be-sent burst data according to the corresponding bandwidth authorization information, that is, a size of the burst data in this embodiment. In addition, the device at the transmit end may send to-be-sent burst data carrying a corresponding start and end flag. The decoding device (such as the CMC) may determine a length of the received burst data by using a burst start flag and a burst end flag that are carried in an RB. In another application scenario, a specific method of determining a data length is a conventional technology, and details are not described herein again.

Certainly, before the coding type is determined, the length of the to-be-coded data in the corresponding burst data needs to be determined. It may be understood that, determining the length of the to-be-coded data in the burst data is a step before the coding method introduced in this embodiment of the present disclosure starts. It should be noted that, in this embodiment of the present disclosure, during the determining an FEC coding type according to a length of to-be-coded data and a correspondence between a data length and an FEC coding type, the FEC coding type may not be determined only after an accurate length of the to-be-coded data is determined. In fact, in an optional solution, when the length of the to-be-coded data is greater than or equal to a threshold, the corresponding coding type may be determined. Specifically, for example, a corresponding coding device generally includes a buffer, a buffering device, or a storage device. The coding device temporarily stores or stores data after receiving the data, and then collects statistics about a length of the temporarily stored or stored data. Optionally, for example, a counting manner may be used. After a count value reaches a set threshold, it indicates that the length of the to-be-coded data is greater than or equal to a corresponding threshold, so that a corresponding FEC coding type can be determined, and meanwhile, next counting starts. Certainly, optionally, a corresponding FEC coding type may be determined according to a length of the entire burst data after the length of the entire burst data is determined.

The correspondence between a data length and an FEC coding type may be specifically represented as a mapping table, may be specifically represented as a logical correspondence, may be a direct correspondence, or may be an indirect correspondence. A specific representation manner of the correspondence is not limited in this embodiment of the present disclosure. The correspondence may be configured when the system performs networking, or may be configured by a network management system after networking is performed; and may be acquired and stored by a corresponding coding device, or may be determined after a corresponding coding device and decoding device negotiate. A specific source of the correspondence is not limited in this embodiment of the present disclosure. It should be noted that, the data length herein may be a range. For example, a data length greater than 10080 bits may be corresponding to an FEC coding type, and a data length less than or equal to 10080 bits and greater than 2550 bits may be corresponding to another coding type. Certainly, it may also be understood that, each data length greater than 10080 bits, that is, all data lengths greater than 10080 bits, such as 10081 bits and 14450 bits, is corresponding to an FEC coding type. Each data length less than or equal to 10080 bits and greater than 2550 bits, that is, 2551 bits, 2552 bits . . . 10080 bits, is corresponding to another coding type.

Optionally, the determining a forward error correction FEC coding type according to a length of to-be-coded data in burst data and a correspondence between a data length and an FEC coding type specifically includes: determining, according to the length of the to-be-coded data in the data, a data length range to which the length of the to-be-coded data belongs; and determining the FEC coding type according to the data length range.

Specifically, in an optional solution, when discovering that the length of the to-be-coded data $L_1 > K_1$, the coding device determines the first FEC coding type corresponding to $K_1$, and performs coding on the burst data by using the first FEC coding type, where $K_1$ is a threshold corresponding to the first FEC coding type. Optionally, when discovering that $L_1 > K_1$, the coding device may search for the first FEC coding type according to a correspondence between $K_1$ and the first FEC coding type, and performs coding on the entire burst data by using the first FEC coding type. Alternatively, $L_1 > K_1$ may be set as a trigger condition. When the condition is met, the coding device performs coding on the entire burst data by using the first FEC coding type, and in this case, the correspondence between $K_1$ and the first FEC coding type is indirect. Specifically, a corresponding step may be implemented by using a corresponding array, or may be implemented by using a field programmable gate array (FPGA), or may be implemented by using a processor, or may be implemented by using another manner. This embodiment of the present disclosure sets no limitation thereto. Accordingly, when $K_{p-1} \geq L_1 > K_p$, the $p^{th}$ FEC coding type corresponding to $K_p$ is determined, coding is performed on the burst data by using the $p^{th}$ FEC coding type, where $K_p$ is a threshold corresponding to the $p^{th}$ FEC coding type, and $K_{p-1}$ is a threshold corresponding to the p-$1^{th}$ FEC coding type; or when $L_1 \leq K_m$, the $m^{th}$ FEC coding type corresponding to $K_m$ is determined, and coding is performed on the burst data by using the $m^{th}$ FEC coding type, where $K_m$ is a threshold corresponding to the $m^{th}$ FEC coding type, where m is an integer greater than or equal to 2, p is any integer in a range that is from 2 to m and that includes 2 and m, and $K_{p-1} > K_p$. Herein, m and p may be any number within respective value ranges. Because $K_{p-1} > K_p$, and p may be any number within the range, it is obvious that $K_1$, $K_2$ ... $K_{p-1}$, $K_p$ ... $K_{m-1}$, $K_m$ are sequentially decreased in terms of a numerical value. In this embodiment, the coding device supports at least two FEC coding manners, and certainly, for a case in which only one FEC coding manner is supported, the method provided in this embodiment can also be used.

As is described above, the length of the to-be-coded data in the burst data refers to a length of the remaining to-be-coded data. When coding starts to be performed, the entire burst data is the to-be-coded data. The FEC coding type may not be determined only after the accurate length of the to-be-coded data and a length of coded data are determined. In fact, in an optional solution, in a real-time coding process, if the length of the to-be-coded data is greater than or equal to a threshold, one-codeword coding is performed, and the length of the remaining to-be-coded data continues to be determined. That is, it only needs to be determined that the length of the to-be-coded data is greater than a threshold, and it is not necessarily required to know the accurate length of the to-be-coded data. In an optional solution, when the length of the to-be-coded data in the burst data is greater than $K_1$, the first FEC coding type corresponding to $K_1$ is determined, and one-codeword coding is performed by using the first FEC coding type, where $K_1$ is a threshold corresponding to the first FEC coding type; or when the length of the to-be-coded data in the burst data is less than or equal to $K_{p-1}$ and is greater than $K_p$, the $p^{th}$ FEC coding type corresponding to $K_p$ is determined, and one-codeword coding is performed by using the $p^{th}$ FEC coding type, where $K_p$ is a threshold corresponding to the $p^{th}$ FEC coding type, and $K_{p-1}$ is a threshold corresponding to the p-$1^{th}$ FEC coding type; or when the length of the to-be-coded data in the burst data is less than or equal to $K_m$ and is greater than 0, the $m^{th}$ FEC coding type corresponding to $K_m$ is determined, and coding is performed on the to-be-coded data in the burst data by using the $m^{th}$ FEC coding type, or one-codeword coding is performed by using the $m^{th}$ FEC coding type, where $K_m$ is a threshold corresponding to the $m^{th}$ FEC coding type, where m is an integer greater than or equal to 2, p is any integer in a range that is from 2 to m and that includes 2 and m, and $K_{p-1} > K_p$. In this solution, the coding device determines, by using the length of the remaining to-be-coded data, an FEC coding type used for one codeword; and after one codeword is obtained by coding, determines an FEC coding type of another codeword according to a length of still remaining to-be-coded data, until coding of the entire burst data is completed.

In the foregoing several manners, optionally, $K_1$, $K_{p-1}$, $K_p$, and $K_m$ may be determined by using the principle that a total length of a parity bit included in data formed by performing coding on the burst data is the shortest. Optionally, $K_1$ is equal to a value obtained by multiplying $k_2$ by an integer part of a quotient obtained by dividing $t_1$ by $t_2$; $K_{p-1}$ is equal to a value obtained by multiplying $k_p$ by an integer part of a quotient obtained by dividing $t_{p-1}$ by $t_p$; $K_p$ is equal to a value obtained by multiplying $k_{p+1}$ by an integer part of a quotient obtained by dividing $t_p$ by $t_{p+1}$; and $K_m$ is equal to a value obtained by multiplying $k_m$ by an integer part of a quotient obtained by dividing $t_{m-1}$ by $t_m$, where $t_1$, $t_2$, $t_{p-1}$, $t_p$, $t_{m-1}$, and $t_m$ are respectively lengths of one-codeword parity bits of the first FEC coding type, the second FEC coding type, the p-$1^{th}$ FEC coding type, the $p^{th}$ FEC coding type, the m-$1^{th}$ FEC coding type, and the $m^{th}$ FEC coding type; and $k_2$, $k_p$, $k_{p+1}$, and $k_m$ are respectively lengths of one-codeword information bits of the second FEC coding type, the $p^{th}$ FEC coding type, the p+$1^{th}$ FEC coding type, and the $m^{th}$ FEC coding type.

Optionally, in another optional solution, the method may further be as follows: first determining a length of the burst data; determining, according to the length of the burst data and the correspondence between a data length and an FEC coding type, an FEC coding type or an FEC coding type sequence corresponding to the length of the burst data; and performing coding according to the determined FEC coding type or FEC coding type sequence.

The following further describes this embodiment of the present disclosure by using LDPC coding as an example.

TABLE 1

| LDPC coding types | Length of an information bit (k) | Code length (n) | Length of a parity bit (t) |
|---|---|---|---|
| 1 | 14400 ($k_1$) | 16200 ($n_1$) | 1800 ($t_1$) |
| 2 | 5040 ($k_2$) | 5940 ($n_2$) | 900 ($t_2$) |
| 3 | 850 ($k_3$) | 1120 ($n_3$) | 270 ($t_3$) |

As shown in Table 1, the LDPC coding is used as an example, it is assumed that the coding device supports LDPC coding having three types of code lengths. It may be understood that, the coding device may further have another FEC coding manner, where the another FEC coding manner may also have multiple types of code lengths, and even multiple types of FEC coding manners may be used in a hybrid manner. This embodiment of the present disclosure sets no limitation thereto.

Figure 5:
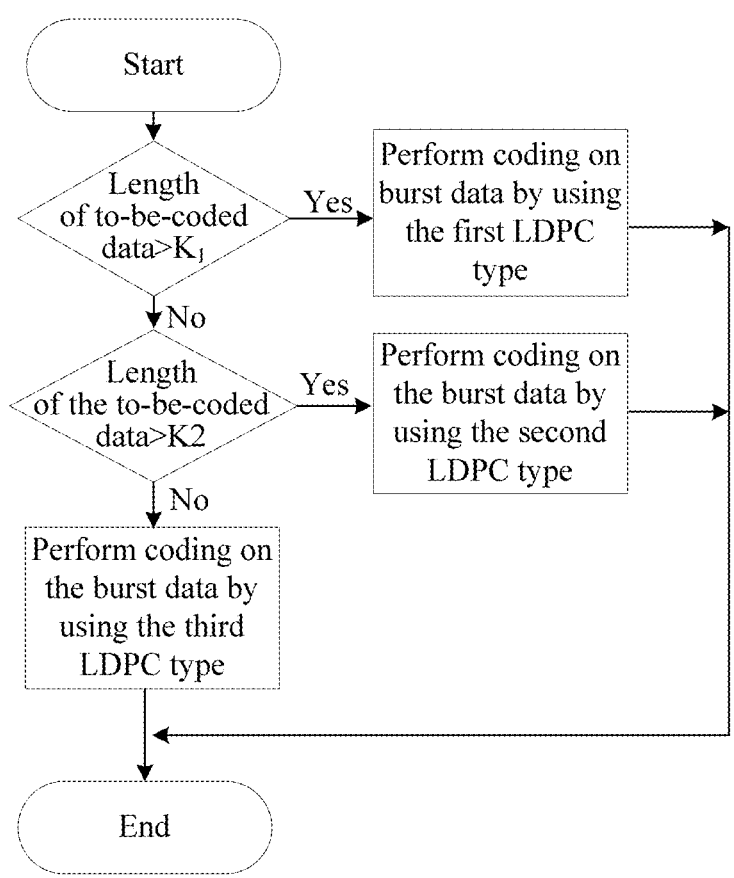
FIG. 5 is a flowchart of another coding method according to Embodiment 1 of the present disclosure.

In an implementation manner, as shown in FIG. 5, when the length of the to-be-coded data $L_1$ is greater than $K_1$, coding is performed on the entire burst data by using the first LDPC type in Table 1. If $L_1$ is not greater than $K_1$, that is, less than or equal to $K_1$, determining continues. If $L_1$ is greater than $K_2$, coding is performed on the entire burst data by using the second LDPC type in Table 1. If $L_1$ is less than or equal to $K_2$, coding is performed on the burst data by using the third LDPC type in Table 1. This is an example, and it may be understood that there may be more coding types supported by the coding device. Accordingly, there may be $K_3$, $K_4$, and the like. In this scenario, the to-be-coded data refers to the entire burst data. In addition, when whether the length of the to-be-coded data is greater than or equal to $K_1$ is determined, it is not necessarily required to first obtain the length of the entire burst data. A result of the determining can be obtained and a corresponding operation is performed as long as it is determined the length of the to-be-coded data is greater than or equal to $K_1$.

Figure 6:
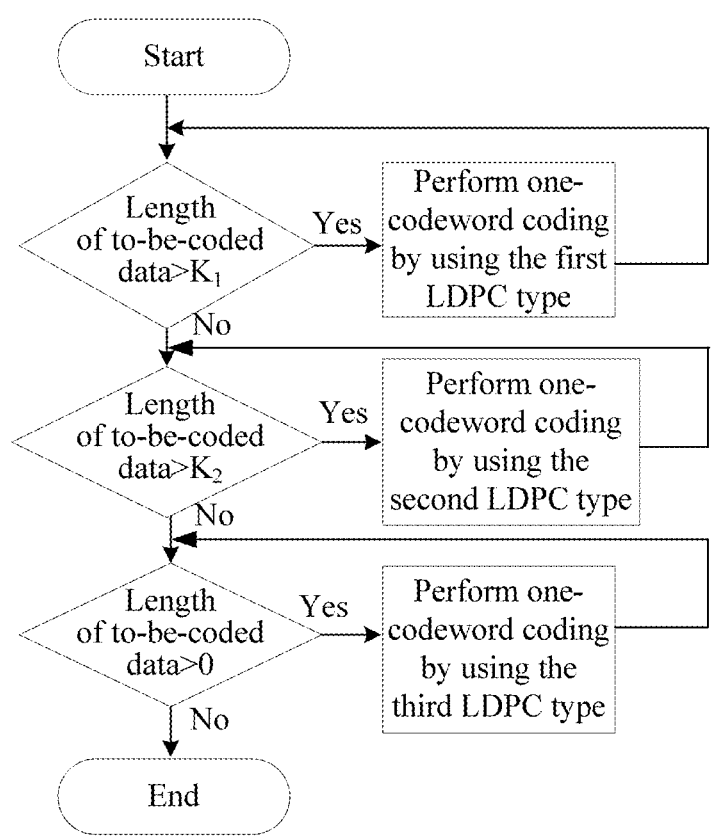
FIG. 6 is a flowchart of still another coding method according to Embodiment 1 of the present disclosure.

In another implementation manner, as shown in FIG. 6, when the length of the to-be-coded data is greater than $K_1$, one-codeword coding is performed by using the first LDPC type, and whether the length of the remaining to-be-coded data is still greater than $K_1$ continues to be determined after one-codeword coding is performed, until the length of the to-be-coded data is less than or equal to $K_1$. That is, after coding starts to be performed, the length of the to-be-coded data is first determined. If the length is greater than $K_1$, one-codeword coding is performed. In this way, the length of the to-be-coded data is certainly a length obtained by subtracting a length of a information bit of one codeword, and then, new to-be-coded data is determined. When a length of the to-be-coded data is less than or equal to $K_1$ and is greater than $K_2$, one-codeword coding is performed by using the second LDPC type corresponding to $K_2$. After one-codeword coding is performed, a length of new remaining to-be-coded data is determined again, until the length of the remaining to-be-coded data is less than or equal to $K_2$. When it is determined that the length of the to-be-coded data is less than or equal to $K_2$ and is greater than 0, optionally, coding may be directly performed on all still remaining to-be-coded data by using the third LDPC type (not shown in the diagram). Alternatively, when it is determined that the length of the to-be-coded data is less than or equal to $K_2$ and is greater than 0, one-codeword coding is performed by using the third LDPC type, and next determining continues until the length of the to-be-coded data is 0.

In solutions shown in FIG. 5 and FIG. 6, values of $K_1$ and $K_2$ may be determined by using the principle that a total length of a parity bit included in data formed by performing coding on the burst data is the shortest. For specific burst data, a data length of the burst data is fixed. When coding is performed on data of a fixed length, a shorter length of a parity bit carried in coded data indicates a higher code rate and higher utilization of a communication resource.

Specifically, $K_1$ and $K_2$ may be set according to the following manner. It may be seen that, lengths of parity bits corresponding to three LDPC types are respectively $t_1 = n_1 - k_1$, $t_2 = n_2 - k_2$, and $t_3 = n_3 - k_3$, where $t_1 > t_2 > t_3$. $num1 = [t_1/t_2]$ and $num2 = [t_2/t_3]$ are calculated, where $[n]$ is a modulo operation and is used to indicate an integer that is not greater than n. That is, the modulo operation is performed on a quotient obtained by dividing $t_1$ by $t_2$, and the modulo operation is performed on a quotient obtained by dividing $t_2$ by $t_3$. $K_1 = num1*k_1$ and $K_2 = num2*k_2$ are set. With reference to the three LDPC types in Table 1, lengths of parity bits of the three LDPC types may be separately obtained: $t_1 = 1800$, $t_2 = 900$, and $t_3 = 270$. It may be obtained, according to the foregoing rule, that $num1 = 2$ and $num2 = 3$, so that $K_1 = 10080$ and $K_2 = 2550$.

It should be noted that, in a solution shown in FIG. 5 in this embodiment, because ti happens to be twice the size of $t_2$, a value of $K_1$ may be any integer greater than or equal to 5040 and less than 10081, and coding is the same. Because whether the first LDPC type or the second LDPC type is used for coding burst data whose size is from 5040 bits to 10081 bits, a length of a generated parity bit is 1800 bits, and an effect is the same.

Optionally, an implementation manner may further be that a threshold is set. Coding is performed on a part of the burst data whose length is greater than the threshold by using an FEC coding type whose code rate is the highest; coding is performed on a remaining part according to an optimal FEC coding type supported by the device or system, and a combination of various FEC coding types for an optimal coding is determined for each data length range.

In another optional solution, a coding type may be determined according to a total length of the burst data. After the length of the burst data is determined, the correspondence between a data length and an FEC coding type is queried according to the length of the burst data; an FEC coding type or FEC coding type sequence corresponding to the length of the burst data is determined; and finally, coding is performed according to the determined FEC coding type or FEC coding type sequence. In this case, a corresponding FEC coding type sequence may be a combination of a series of coding types. The correspondence between a data length and an FEC coding type may be represented as a mapping table, or may be represented in other manners. The embodiment of the present disclosure sets no limitation. When the correspondence is represented as a table, optionally, the correspondence in a case (LDPC coding types in Table 1 are still used as an example) may be shown in Table 2. In the table, $[L_1/k_1]$ is a value obtained by performing a modulo operation on a quotient obtained by dividing $L_1$ by $k_1$, and $T_1$, $T_2$, and $T_3$ are respectively codewords of the first, the second, and the third LDPC coding types in Table 1, where a value of $\{[L_1/k_1]+1\}*T_3$ may sequentially be $1T_3$, $2T_3$, or $3T_3$ as $L_1$ changes; and a value of $\{[(L_1-5040)/k_1]+1\}T_3$ may sequentially be $1T_3$, $2T_3$, or $3T_3$ as $L_1$ changes. Table 2 only shows a combination of three FEC coding types. In fact, when FEC coding types that have more types of code lengths exist, the combination may be richer, and a code rate may be higher. Table 2 is only a part of the mapping table, and it may be understood that, when the length of the burst data is greater than 14400 bits, a difference lies in a quantity of $T_1$. Coding is still performed according to a correspondence in Table 2 between $L_1$ and a remainder obtained by dividing the length of the burst data by 14400 bits.

TABLE 2

| Length $L_1$ of burst data | Coding type sequence |
| --- | --- |
| (0, 2550] | $\{[L_1/k_1] + 1\} * T_3$ |
| (2550, 5040] | $T_2$ |
| (5040, 7590] | $T_2 + \{[(L_1 - 5040)/k_1] + 1\}T_3$ |
| (7590, 10080] | $2T_2$ or $T_1$ |
| (10080, 14400] | $T_1$ |

Figure 7A:
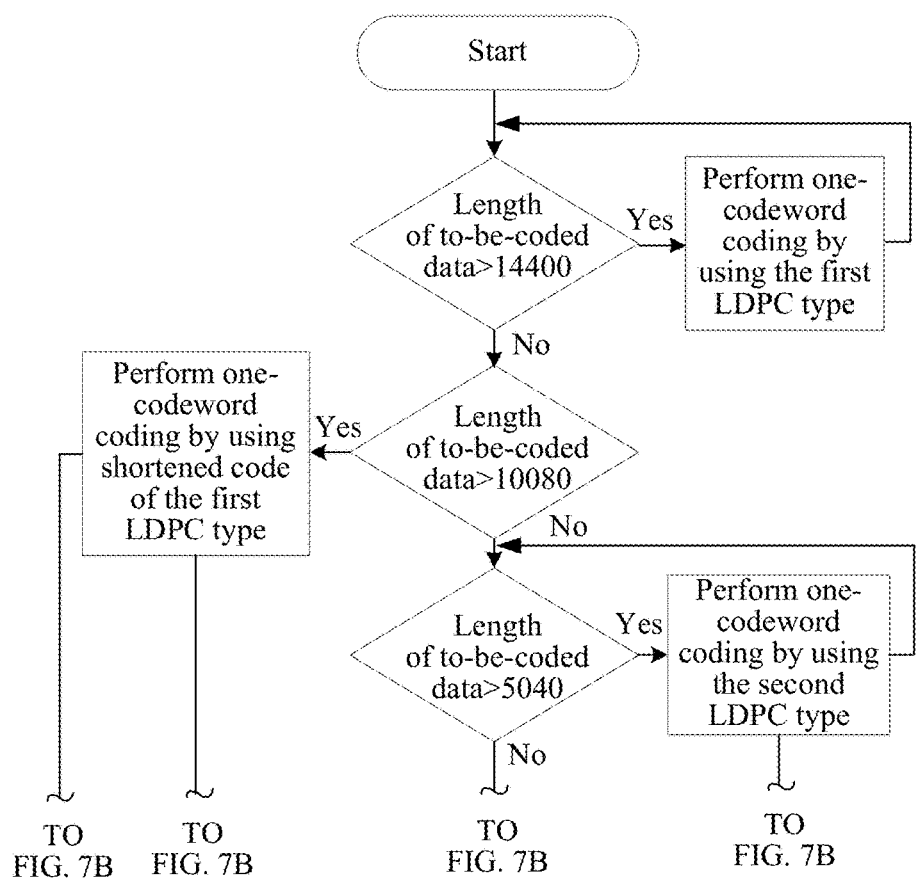
FIG. 7A and FIG. 7B are a flowchart of yet another coding method according to Embodiment 1 of the present disclosure.
Figure 7B:
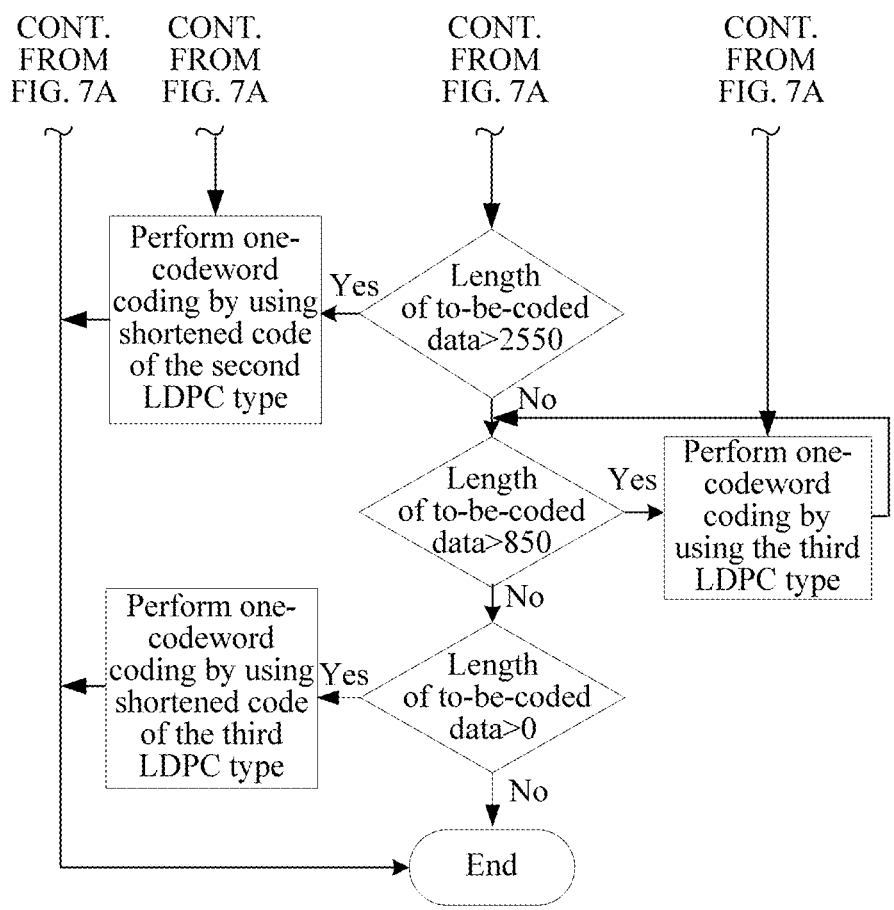

It may be understood that, when a corresponding data length is not enough for performing one-codeword coding, coding may be performed by using a shortened code (shortened code) manner. Certainly, coding performed by using shortened code of an FEC coding type still belongs to coding performed by using the FEC coding type. For example, coding performed on a codeword by using shortened code of the first LDPC coding type still belongs to coding performed by using the first LDPC coding type. Specifically, as shown in FIG. 7A and FIG. 7B, values of K in the diagram are only examples, and are not corresponding to values in Table 2. After coding starts to be performed, if the length of the to-be-coded data is greater than 14400, one-codeword coding is performed by using the first LDPC type; and if the length of the to-be-coded data is less than or equal to 14400 and is greater than 10080, one-codeword coding is performed by using shortened code of the first LDPC type, and coding is ended. If the length of the to-be-coded data is less than or equal to 10080 and is greater than 5040, one-codeword coding is performed by using shortened code of the second LDPC type; and if the length of the to-be-coded data is less than or equal to 5040 and is greater than 2550, one-codeword coding is performed by using shortened code of the second LDPC type, and coding is ended. If the length of the to-be-coded data is less than or equal to 5040 and is greater than 850, one-codeword coding is performed by using shortened code of the third LDPC type; and if the length of the to-be-coded data is less than or equal to 850 and is greater than 0, one-codeword coding is performed by using shortened code of the third LDPC type, and coding is ended.

Corresponding to the coding method, an embodiment of the present disclosure further provides a decoding method.

Figure 8:
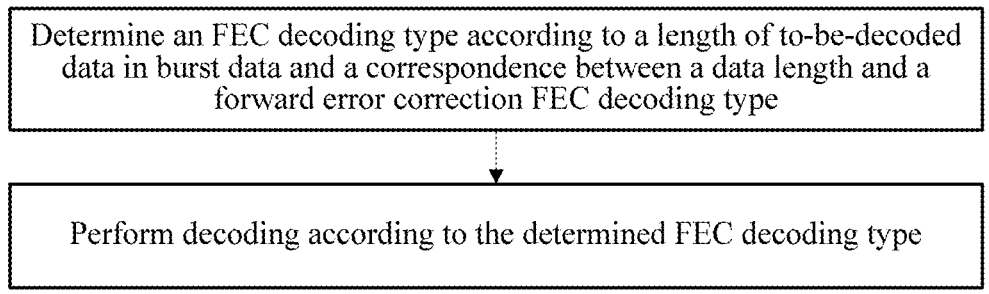
FIG. 8 is a flowchart of a decoding method according to Embodiment 1 of the present disclosure.

As shown in FIG. 8, the decoding method includes: determining an FEC decoding type according to a length of to-be-decoded data in burst data and a correspondence between a data length and a forward error correction FEC decoding type; and performing decoding according to the determined FEC decoding type, where there are at least two different data length ranges that are respectively corresponding to two different FEC decoding types; the to-be-decoded data is obtained by coding by using an FEC coding type; a length of the to-be-decoded data obtained after coding is corresponding to the FEC coding type; and the determined FEC decoding type is corresponding to the FEC coding type.

Optionally, the determining an FEC decoding type according to a length of to-be-decoded data in burst data and a correspondence between a data length and a forward error correction FEC decoding type and the performing decoding according to the determined FEC decoding type specifically include: when $L_2>N_1$, determining the first FEC decoding type corresponding to $N_1$, and performing decoding on the burst data by using the first FEC decoding type, where $L_2$ is the length of the to-be-decoded data, and $N_1$ is a threshold corresponding to the first FEC decoding type; or when $N_{p-1} \geq L_2 > N_p$, determining the $p^{th}$ FEC decoding type corresponding to $N_p$, performing decoding on the burst data by using the $p^{th}$ FEC decoding type, where $N_p$ is a threshold corresponding to the $p^{th}$ FEC decoding type, and $N_{p-1}$ is a threshold corresponding to the p-1$^{th}$ FEC decoding type; or when $L_2 \leq N_m$, determining the $m^{th}$ FEC decoding type corresponding to $N_m$, and performing decoding on the burst data by using the $m^{th}$ FEC decoding type, where $N_m$ is a threshold corresponding to the $m^{th}$ FEC decoding type, where m is an integer greater than or equal to 2, p is any integer in a range that is from 2 to m and that includes 2 and m, and $N_{p-1}>N_p$.

Optionally, the determining an FEC decoding type according to a length of to-be-decoded data in burst data and a correspondence between a data length and a forward error correction FEC decoding type and the performing decoding according to the determined FEC decoding type specifically include: when the length of the to-be-decoded data in the burst data is greater than $N_1$, determining the first FEC decoding type corresponding to $N_1$, and performing one-codeword decoding by using the first FEC decoding type, where $N_1$ is a threshold corresponding to the first FEC decoding type; or when the length of the to-be-decoded data in the burst data is less than or equal to $N_{p-1}$ and is greater than $N_p$, determining the $p^{th}$ FEC decoding type corresponding to $N_p$, and performing one-codeword decoding by using the $p^{th}$ FEC decoding type, where $N_p$ is a threshold corresponding to the $p^{th}$ FEC decoding type, and $N_{p-1}$ is a threshold corresponding to the p-1$^{th}$ FEC decoding type; or when the length of the to-be-decoded data in the burst data is less than or equal to $N_m$ and is greater than 0, determining the $m^{th}$ FEC decoding type corresponding to $N_m$, and performing decoding on remaining to-be-decoded data in the burst data by using the $m^{th}$ FEC decoding type, or performing one-codeword decoding by using the $m^{th}$ FEC decoding type, where $N_m$ is a threshold corresponding to the $m^{th}$ FEC decoding type, where m is an integer greater than or equal to 2, p is any integer in a range that is from 2 to m and that includes 2 and m, and $N_{p-1}>N_p$.

Optionally, the threshold $N_1$ corresponding to the first FEC decoding type, the threshold $N_{p-1}$ corresponding to the p-1$^{th}$ FEC decoding type, the threshold $N_p$ corresponding to the $p^{th}$ FEC decoding type, and the threshold $N_m$ corresponding to the $m^{th}$ FEC decoding type are determined by using a principle that a total length of a parity bit carried in the burst data is the shortest. Optionally, $N_1$ is equal to a value obtained by multiplying $n_2$ by an integer part of a quotient obtained by dividing $t_1$ by $t_2$; $N_{p-1}$ is equal to a value obtained by multiplying $n_p$ by an integer part of a quotient obtained by dividing $t_{p-1}$ by $t_p$; $N_p$ is equal to a value obtained by multiplying $n_{p+1}$ by an integer part of a quotient obtained by dividing $t_p$ by $t_{p+1}$; and $N_m$ is equal to a value obtained by multiplying $n_m$ by an integer part of a quotient obtained by dividing $t_{m-1}$ by $t_m$, where $t_1$, $t_2$, $t_{p-1}$, $t_p$, $t_{m-1}$, and $t_m$ are respectively lengths of one-codeword parity bits of the first FEC coding type, the second FEC coding type, the p-1$^{th}$ FEC coding type, the $p^{th}$ FEC coding type, the m-1$^{th}$ FEC coding type, and the $m^{th}$ FEC coding type; and $n_2$, $n_p$, $n_{p+1}$, and $n_m$ are respectively one-codeword lengths of the second FEC coding type, the $p^{th}$ FEC coding type, the p+1$^{th}$ FEC coding type, and the $m^{th}$ FEC coding type.

Optionally, the decoding method further includes: determining a length of the burst data; the determining a forward error correction FEC decoding type according to a length of to-be-decoded data in the burst data specifically includes: determining, according to the length of the burst data and the correspondence between a data length and an FEC decoding type, an FEC decoding type or FEC decoding type sequence corresponding to the length of the burst data; and the performing decoding according to the determined FEC decoding type specifically includes: performing decoding according to the determined FEC decoding type or FEC decoding type sequence.

It may be understood that, the burst data decoding method provided in this embodiment of the present disclosure is used with the coding method provided above. Thresholds and the like that are used in the decoding method are corresponding to thresholds in the coding method. It should be noted that, in the coding method, an FEC coding type is determined according to a length of to-be-coded data, and in the decoding method, the FEC decoding type is determined according to the length of the to-be-decoded data. For burst data in transmission, the length of the to-be-coded data herein is not equal to the length of the to-be-decoded data. Coded data generated after coding is performed on the to-be-coded data is the to-be-decoded data. However, there is a correspondence between a length of to-be-coded data in burst data and a length of to-be-decoded data formed by performing coding.

The following describes in detail the decoding method with reference to specific application scenarios.

The FEC coding type of the to-be-decoded data is corresponding to the length of the to-be-decoded data, and the FEC decoding type is corresponding to the FEC coding type. There is a correspondence between to-be-coded data and to-be-decoded data obtained after coding. For a codeword, a length of the codeword is divided into two parts, which are respectively a length of an information bit and a length of a parity bit, where the length of the information bit represents a length of to-be-sent data when coding is performed, that is, a length of the to-be-coded data; and a code length of a codeword obtained after coding represents a length of the to-be-decoded data. It may be seen from FIG. 3 that, a relationship between the length of the to-be-coded data and the length of the to-be-decoded data is a relationship between n and k, and therefore, the decoding device may successfully perform decoding as long as a corresponding coding rule and corresponding to-be-decoded data are known to the decoding device. In this embodiment of the present disclosure, the coding rule is: determining an FEC coding type according to the length of the to-be-coded data, and performing coding according to the determined FEC coding type. Specifically, in this embodiment of the present disclosure, the decoding device configures a decoding rule corresponding to the coding rule for the coding device to perform coding, and then sequentially implement all steps described in this embodiment of the present disclosure. It is easy to understand that, in a communications system, in a networking or device configuration stage, or even in a device manufacturing stage, the decoding rule corresponding to the coding rule of the coding device is configured for the decoding device.

According to description for the foregoing coding method, it may be understood that, as the length of the to-be-coded data increases linearly, a parity bit in a coding process monotonically increases. That is, a longer length of the to-be-coded data indicates a longer (or equal) total length of the parity bit increased in the coding process and a longer total length of coded data. That is, lengths of to-be-decoded data that is formed by performing coding on to-be-coded data of different lengths are different, so that the decoding device may correctly perform decoding.

It should be understood that, the coding method in this embodiment is in a one-to-one correspondence with the decoding method, that is, corresponding parameters and thresholds in the decoding device are corresponding to corresponding parameters and thresholds in the coding device. For example, thresholds $K_1$, $K_{p-1}$, $K_p$, and $K_m$ in the coding process are respectively corresponding to thresholds $N_1$, $N_{p-1}$, $N_p$, and $N_m$ in a decoding process.

The to-be-decoded data in the burst data may refer to entire to-be-decoded burst data, or may refer to remaining to-be-decoded data in the burst data. It may be understood that, when decoding starts to be performed, entire burst data is not decoded, and therefore, the entire burst data is the to-be-decoded data. The burst data may need to be divided into multiple codewords so as to be decoded, so that in the decoding process, a case in which decoding of a part of the burst data is already completed, and a remaining part of data still waits to be decoded inevitably occurs. Certainly, when an amount of the burst data is relatively small, in a case in which decoding may be completed by using one codeword, the to-be-decoded data refers to the entire burst data.

It should be noted that, in this embodiment of the present disclosure, during the determining an FEC decoding type according to a length of to-be-decoded data and a correspondence between a data length and an FEC decoding type, the FEC decoding type may not be determined only after an accurate length of the to-be-decoded data is determined. In fact, in an optional solution, when the length of the to-be-decoded data is greater than a threshold, the corresponding decoding type may be determined. Specifically, for example, a corresponding decoding device generally includes a buffer, a buffering device, or a storage device. The decoding device temporarily stores or stores data after receiving the data, and then collects statistics about a length of the temporarily stored or stored data. Optionally, for example, a counting manner may be used. After a count value reaches a set threshold, it indicates that the length of the to-be-decoded data is greater than or equal to a corresponding threshold, so that a corresponding FEC decoding type can be determined, and meanwhile, next counting starts. Certainly, optionally, a corresponding FEC decoding type may also be determined according to a length of the entire burst data after the length of the entire burst data is determined.

As shown in Table 1, LDPC decoding is used as an example, it is assumed that the decoding device supports LDPC decoding having three types of code lengths. It may be understood that, the decoding device may further have another FEC decoding manner, where the another FEC decoding manner may also have multiple types of code lengths, and even multiple types of FEC decoding manners may be used in a hybrid manner. This embodiment of the present disclosure sets no limitation thereto.

Figure 9:
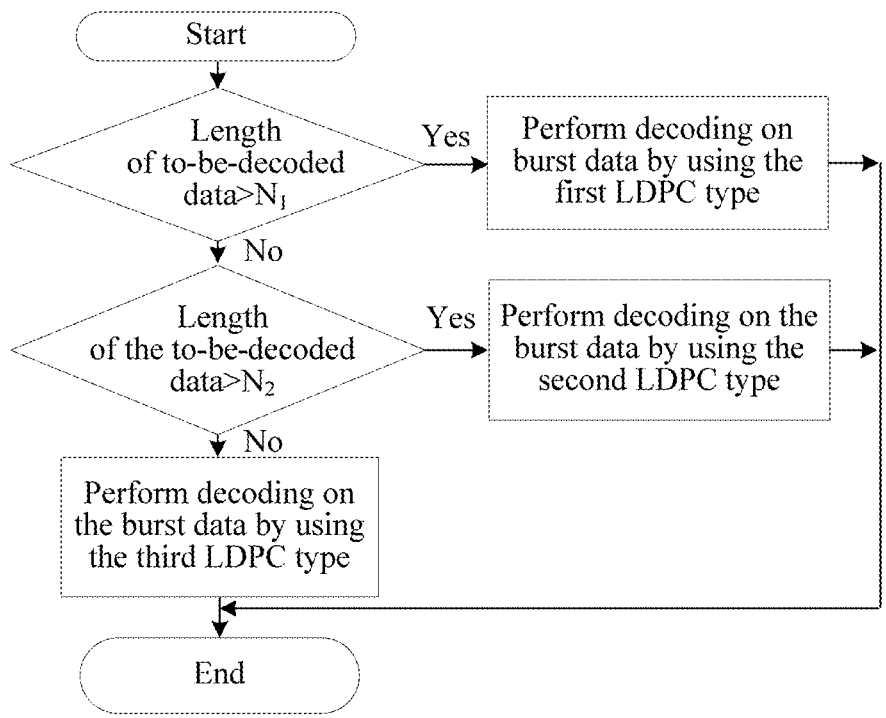
FIG. 9 is a flowchart of another decoding method according to Embodiment 1 of the present disclosure.

In an implementation manner, as shown in FIG. 9, the decoding method may be used with the coding method in FIG. 5. When the length of the to-be-decoded data $L_2$ is greater than $N_1$, decoding is performed on the entire burst data by using the first LDPC type in Table 1. If $L_2$ is less than or equal to $N_1$, determining continues. If $L_2$ is greater than $N_2$, decoding is performed on the entire burst data by using the second LDPC type in Table 1. If $L_2$ is less than or equal to $N_2$, decoding is performed on the entire burst data by using the third LDPC type in Table 1. This is an example, and it may be understood that there may be more decoding types supported by the decoding device. Accordingly, there may be $N_3$, $N_4$, and the like. In this scenario, the to-be-decoded data refers to the entire burst data. In addition, when whether the length of the to-be-decoded data is greater than or equal to $N_1$ is determined, it is not necessarily required to first obtain the length of the entire burst data. A result of the determining can be obtained and a corresponding operation is performed as long as it is determined the length of the to-be-decoded data is greater than or equal to $N_1$.

Figure 10:
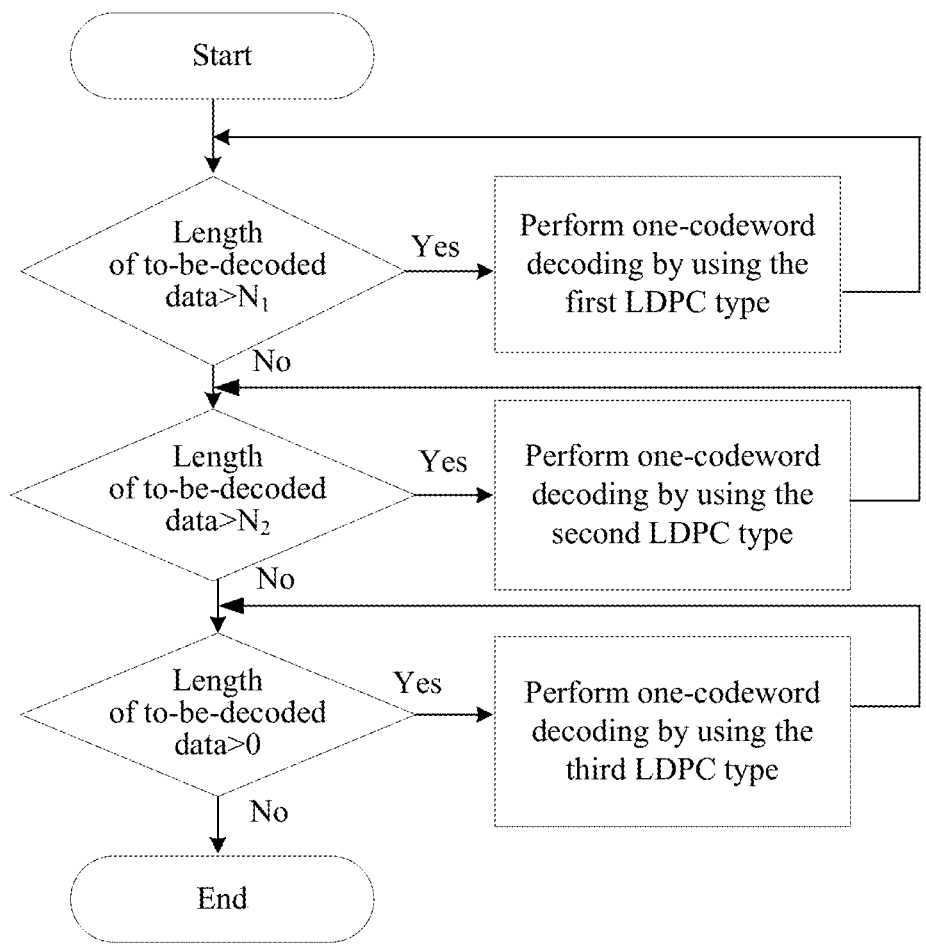
FIG. 10 is a flowchart of still another decoding method according to Embodiment 1 of the present disclosure.

In another implementation manner, as shown in FIG. 10, the decoding method may be used with the coding method in FIG. 6. When the length of the to-be-decoded data is greater than $N_1$, one-codeword decoding is performed by using the first LDPC type, and whether the length of the to-be-decoded data is still greater than $N_1$ continues to be determined after one-codeword decoding is performed, until a length of remaining to-be-decoded data is less than or equal to $N_1$. That is, after decoding starts to be performed, the length of the to-be-decoded data is first determined. If the length is greater than $N_1$, one-codeword decoding is performed. In this way, the length of the to-be-decoded data is certainly a length obtained by subtracting a length of one codeword, and then, new to-be-decoded data is determined. When a length of the to-be-decoded data is less than or equal to $N_1$ and is greater than $N_2$, one-codeword decoding is performed by using the second LDPC type corresponding to $N_2$. After one-codeword decoding is performed, a length of new remaining to-be-decoded data is determined again, until the length of the remaining to-be-decoded data is less than or equal to $N_2$. When it is determined that the length of the to-be-decoded data is less than or equal to $N_2$ and is greater than 0, optionally, decoding may be directly performed on all still remaining to-be-decoded data by using the third LDPC type (not shown in the diagram). Alternatively, when it is determined that the length of the to-be-decoded data is less than or equal to $N_2$ and is greater than 0, one-codeword decoding is performed by using the third LDPC type, and next determining continues until the length of the to-be-decoded data is 0.

In solutions of FIG. 9 and FIG. 10, values of $N_1$ and $N_2$ may be determined by using the principle that a total length of a parity bit carried in the burst data is the shortest. For specific burst data, a data length of the burst data is fixed. When coding is performed on data of a fixed length, a shorter length of a parity bit carried in coded data indicates a higher code rate and higher utilization of a communication resource. Accordingly, when decoding is performed, by setting a corresponding parameter, decoding may also be performed on a codeword coded by using this coding manner. Specifically, $N_1$ and $N_2$ may be set according to the following manner. It may be seen that, lengths of parity bits corresponding to three LDPC types are respectively $t_1=n_1-k_1$, $t_2=n_2-k_2$, and $t_3=n_3-k_3$, where $t_1>t_2>t_3$. $num1=[t_1/t_2]$ and $num2=[t_2/t_3]$ are calculated, where $[n]$ is a modulo operation and is used to indicate an integer that is not greater than n. That is, the modulo operation is performed on a quotient obtained by dividing $t_1$ by $t_2$, and the modulo operation is performed on a quotient obtained by dividing $t_2$ by $t_3$. $N_1=num1*n_1$ and $N_2=num2*n_2$ are set. With reference to the three LDPC types in Table 1, lengths of parity bits of the three LDPC types may be separately obtained: $t_1=1800$, $t_2=900$, and $t_3=270$. It may be obtained, according to the foregoing rule, that $num1=2$ and $num2=3$, so that $N_1=11880$ and $N_2=3360$.

In another optional solution, a decoding type may be determined according to a total length of the burst data. After the length of the burst data is determined, an FEC decoding type or FEC decoding type sequence corresponding to the length of the burst data is determined according to the length of the burst data and the correspondence between a data length and an FEC decoding type; and at last, decoding is performed according to the determined FEC decoding type or FEC decoding type sequence. In this case, a corresponding FEC decoding type sequence may be a combination of a series of decoding types. The correspondence between a data length and an FEC decoding type may be represented as a mapping table, or may be represented in other manners. The present disclosure sets no limitation. The corresponding mapping table is corresponding to Table 2. A range of a length of to-be-decoded burst data generated after coding is performed by using a fixed coding type sequence is also fixed, so that a decoding type sequence corresponding to the coding type sequence used for performing coding may be determined according to the length of to-be-decoded burst data.

According to the burst data coding method and decoding method, and the corresponding communications system that are provided in this embodiment of the present disclosure, a transmit end determines a forward error correction FEC coding type according to a length of to-be-coded data in burst data, and performs coding according to the determined FEC coding type. A receive end determines a forward error correction FEC decoding type according to a length of to-be-decoded data in received burst data, and performs decoding according to the determined FEC decoding type. The burst data coding method and decoding method, and the corresponding communications system that are provided in this embodiment of the present disclosure support different FEC coding and decoding types. Compared with a single FEC coding and decoding type, a coding and decoding type is flexibly selected according to the data length, thereby reducing a parity bit that needs to be sent, reducing redundancy, and improving utilization of a communication resource. In addition, because the transmit end and the receive end independently select an FEC coding and decoding type according to the data length, a corresponding FEC parameter does not need to be transmitted, thereby reducing a communication resource.

Figure 11A:
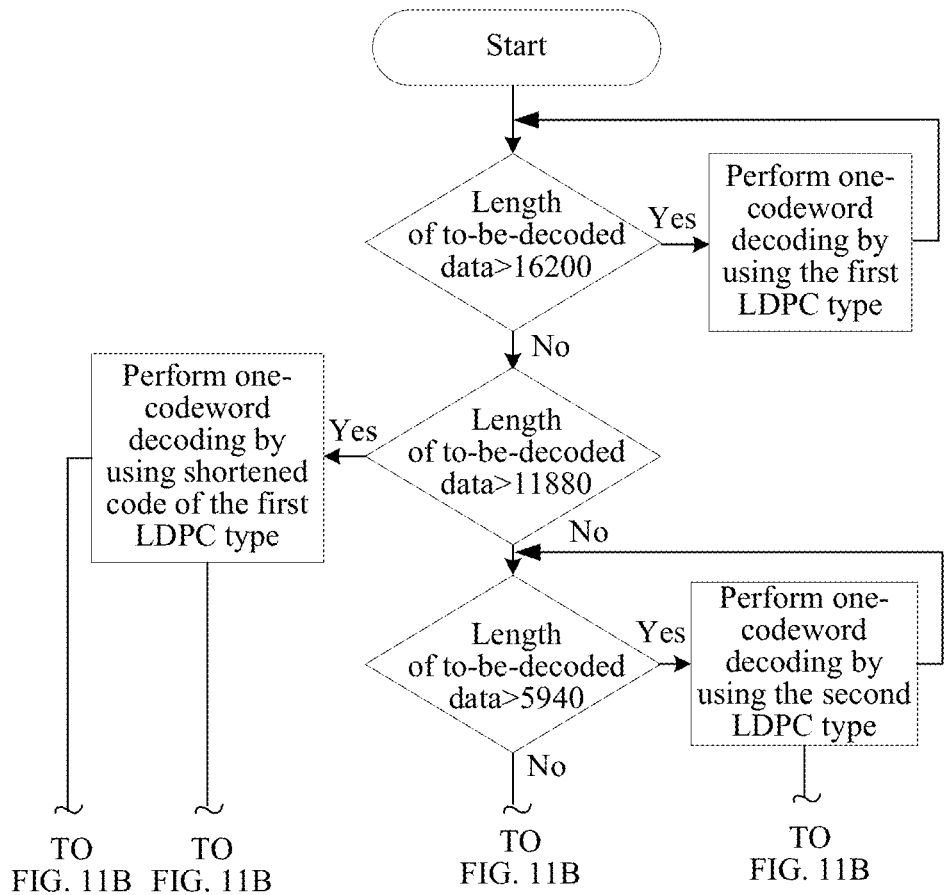
FIG. 11A and FIG. 11B are a flowchart of yet another decoding method according to Embodiment 1 of the present disclosure.
Figure 11B:
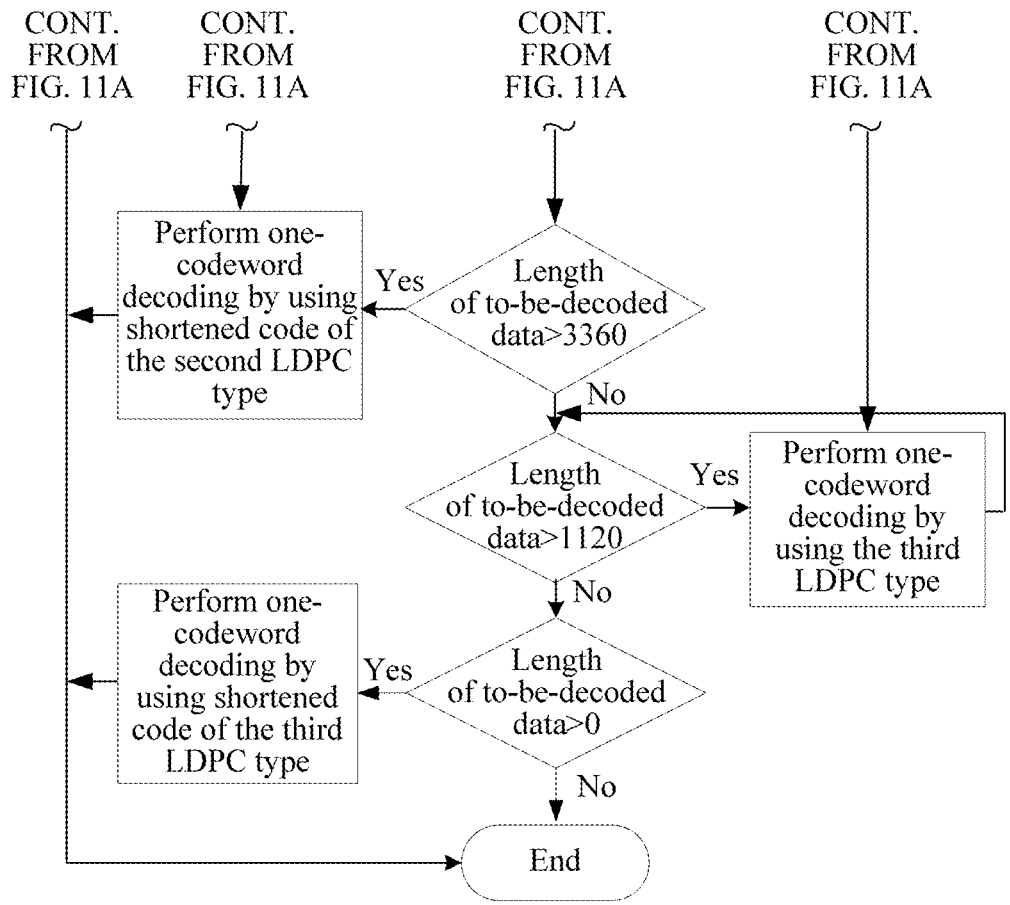

It may be understood that, when a corresponding data length is not enough for performing one-codeword decoding, decoding may be performed by using a shortened code (shortened code) manner. Certainly, decoding performed by using shortened code of an FEC decoding type still belongs to decoding performed by using the FEC decoding type. For example, decoding performed on a codeword by using shortened code of the first LDPC decoding type still belongs to decoding performed by using the first LDPC decoding type. Specifically, as shown in FIG. 11A and FIG. 11B, values of N in the diagram are only examples. After decoding starts to be performed, if the length of the to-be-decoded data is greater than 16200, one-codeword decoding is performed by using the first LDPC type; and if the length of the to-be-decoded data is less than or equal to 16200 and is greater than 11880, one-codeword decoding is performed by using shortened code of the first LDPC type, and decoding is ended. If the length of the to-be-decoded data is less than or equal to 11880 and is greater than 5940, one-codeword decoding is performed by the second LDPC type; and if the length of the to-be-decoded data is less than or equal to 5940 and is greater than 3360, one-codeword decoding is performed by using shortened code of the second LDPC type, and decoding is ended. If the length of the to-be-decoded data is less than or equal to 3360 and is greater than 1120, one-codeword decoding is performed by using the third LDPC type; and if the length of the remaining to-be-decoded data is less than or equal to 1120 and is greater than 0, one-codeword decoding is performed by using shortened code of the third LDPC type, and decoding is ended.

In Embodiment 2, this embodiment of the present disclosure provides a burst data coding device, a burst data decoding device, and a corresponding communications system. The coding device and decoding device that are provided in this embodiment of the present disclosure may implement corresponding functions by using the coding method and decoding method that are provided in Embodiment 1, and in Embodiment 1, the corresponding coding method and decoding method may be implemented by using the coding device and decoding device that are provided in this embodiment. The two embodiments are based on a same principle, and implementation steps and technical details may be mutually supportive.

Figure 12:
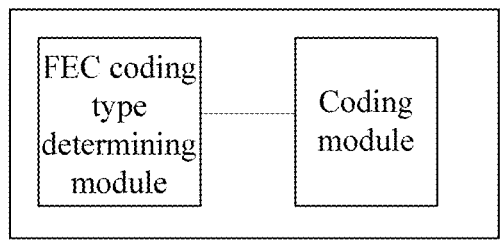
FIG. 12 is a structural diagram of a coding device according to Embodiment 2 of the present disclosure.

As shown in FIG. 12, this embodiment of the present disclosure provides a burst data coding device, including: an FEC coding type determining module, configured to determine an FEC coding type according to a length of to-be-coded data in burst data and a correspondence between a data length and a forward error correction FEC coding type; and a coding module, configured to perform coding according to the FEC coding type determined by the FEC coding type determining module.

Optionally, the FEC coding type determining module is specifically configured to: when $L_1>K_1$, determine the first FEC coding type corresponding to $K_1$, where $L_1$ is the length of the to-be-coded data, and $K_1$ is a threshold corresponding to the first FEC coding type; or when $K_{p-1} \geq L_1 > K_p$, determine the $p^{th}$ FEC coding type corresponding to $K_p$, where $K_p$ is a threshold corresponding to the $p^{th}$ FEC coding type, and $K_{p-1}$ is a threshold corresponding to the $p-1^{th}$ FEC coding type; or when $L_1 \leq K_m$, determine the $m^{th}$ FEC coding type corresponding to $K_m$, where $K_m$ is a threshold corresponding to the $m^{th}$ FEC coding type, where m is an integer greater than or equal to 2, p is any integer in a range that is from 2 to m and that includes 2 and m, and $K_{p-1} > K_p$. The coding module is specifically configured to perform coding on the burst data by using the FEC coding type determined by the FEC coding type determining module.

Optionally, the FEC coding type determining module is specifically configured to: when the length of the to-be-coded data in the burst data is greater than $K_1$, determine the first FEC coding type corresponding to $K_1$, where $K_1$ is a threshold corresponding to the first FEC coding type; or when the length of the to-be-coded data in the burst data is less than or equal to $K_{p-1}$ and is greater than $K_p$, determine the $p^{th}$ FEC coding type corresponding to $K_p$, where $K_p$ is a threshold corresponding to the $p^{th}$ FEC coding type, and $K_{p-1}$ is a threshold corresponding to the $p-1^{th}$ FEC coding type; or when the length of the to-be-coded data in the burst data is less than or equal to $K_m$ and is greater than 0, determine the $m^{th}$ FEC coding type corresponding to $K_m$, where $K_m$ is a threshold corresponding to the $m^{th}$ FEC coding type, where m is an integer greater than or equal to 2, p is any integer in a range that is from 2 to m and that includes 2 and m, and $K_{p-1} > K_p$. The coding module is specifically configured to perform one-codeword coding according to the FEC coding type determined by the FEC coding type determining module.

Optionally, the threshold $K_1$ corresponding to the first FEC coding type, the threshold $K_{p-1}$ corresponding to the $p-1^{th}$ FEC coding type, the threshold $K_p$ corresponding to the $p^{th}$ FEC coding type, and the threshold $K_m$ corresponding to the $m^{th}$ FEC coding type are determined by using a principle that a total length of a parity bit included in data formed by performing coding on the burst data is the shortest. Optionally, $K_1$ is equal to a value obtained by multiplying $k_2$ by an integer part of a quotient obtained by dividing $t_1$ by $t_2$; $K_{p-1}$ is equal to a value obtained by multiplying $k_p$ by an integer part of a quotient obtained by dividing $t_{p-1}$ by $t_p$; $K_p$ is equal to a value obtained by multiplying $k_{p+1}$ by an integer part of a quotient obtained by dividing $t_p$ by $t_{p+1}$; and $K_m$ is equal to a value obtained by multiplying $k_m$ by an integer part of a quotient obtained by dividing $t_{m-1}$ by $t_m$, where $t_1$, $t_2$, $t_{p-1}$, $t_p$, $t_{m-1}$, and $t_m$ are respectively lengths of one-codeword parity bits of the first FEC coding type, the second FEC coding type, the $p-1^{th}$ FEC coding type, the $p^{th}$ FEC coding type, the $m-1^{th}$ FEC coding type, and the $m^{th}$ FEC coding type; and $k_2$, $k_p$, $k_{p+1}$, and $k_m$ are respectively lengths of one-codeword information bits of the second FEC coding type, the $p^{th}$ FEC coding type, the $p+1^{th}$ FEC coding type, and the $m^{th}$ FEC coding type.

Optionally, the coding device further includes a data length determining module, configured to determine a length of the burst data. The FEC coding type determining module is specifically configured to: query the correspondence between a data length and an FEC coding type according to the length of the burst data, and determine an FEC coding type or an FEC coding type sequence corresponding to the length of the burst data; and the coding module is specifically configured to perform coding according to the determined FEC coding type or FEC coding type sequence.

Figure 14:
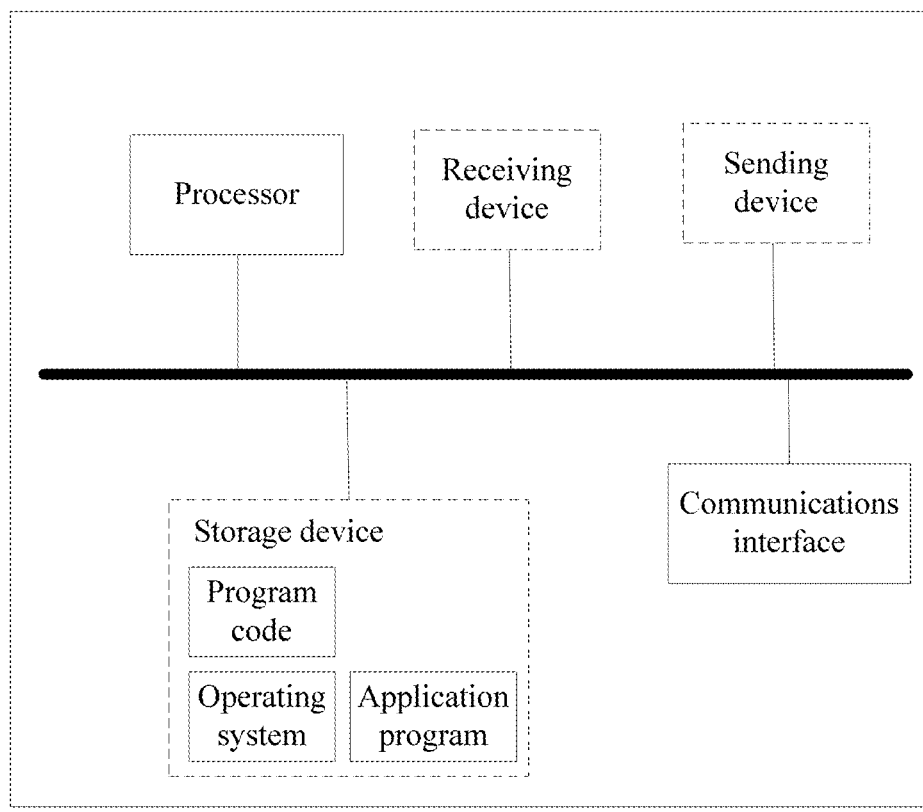
FIG. 14 is a structural diagram of another coding device or decoding device according to Embodiment 2 of the present disclosure.

In a scenario, the foregoing coding device may be a device in FIG. 14. Specifically, functions of the FEC coding type determining module and the coding module may be implemented by using a processor in FIG. 14. Specifically, a corresponding processing function may be solidified in corresponding hardware, for example, the processor may be specifically represented as a field programmable gate array (FPGA), or may be represented as a corresponding logic array, a digital signal processor (DSP), or the like. The foregoing is only an example, and this embodiment of the present disclosure sets no limitation on a specific component for implementing functions in this embodiment of the present disclosure. In another scenario, optionally, the coding device shown in FIG. 12 may further include a storage device. The storage device may store corresponding program code, an operating system, and an application program; and the processor is configured to execute the program code in the storage device, and when the program code is executed, the processor may implement the functions of the FEC coding type determining module and the coding module. Optionally, the coding device may further include a receiving device and a sending device, which are respectively configured to receive data and send the data; and a communications interface, configured to perform communication between internal components of the coding device.

Figure 13:
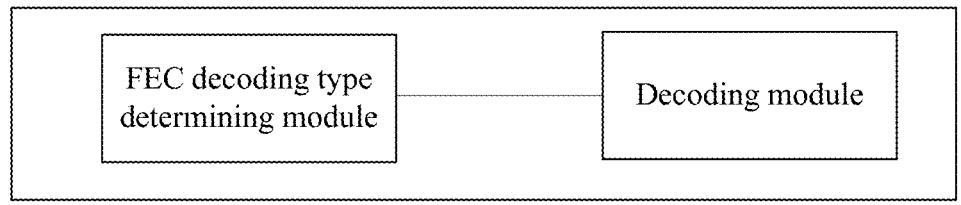
FIG. 13 is a structural diagram of a decoding device according to Embodiment 2 of the present disclosure.

As shown in FIG. 13, this embodiment of the present disclosure provides a burst data decoding device, including: an FEC decoding type determining module, configured to determine an FEC decoding type according to a length of to-be-decoded data in burst data and a correspondence between a data length and a forward error correction FEC decoding type, where the to-be-decoded data is obtained by coding by using an FEC coding type; a length of the to-be-decoded data obtained after coding is corresponding to the FEC coding type; and the determined FEC decoding type is corresponding to the FEC coding type; and a decoding module, configured to perform decoding according to the FEC decoding type determined by the FEC decoding type determining module.

Optionally, the FEC decoding type determining module is specifically configured to: when $L_2 > N_1$, determine the first FEC decoding type corresponding to $N_1$, where $L_2$ is the length of the to-be-decoded data, and $N_1$ is a threshold corresponding to the first FEC decoding type; or when $N_{p-1} \geq L_2 > N_p$, determine the $p^{th}$ FEC decoding type corresponding to $N_p$, where $N_p$ is a threshold corresponding to the $p^{th}$ FEC decoding type, and $N_{p-1}$ is a threshold corresponding to the $p-1^{th}$ FEC decoding type; or when $L_2 \leq N_m$, determine the $m^{th}$ FEC decoding type corresponding to $N_m$, where $N_m$ is a threshold corresponding to the $m^{th}$ FEC decoding type, where m is an integer greater than or equal to 2, p is any integer in a range that is from 2 to m and that includes 2 and m, and $N_{p-1} > N_p$. The decoding module is specifically configured to perform decoding on the burst data according to the FEC decoding type determined by the FEC decoding type determining module.

Optionally, the FEC decoding type determining module is specifically configured to: when the length of the to-be-decoded data in the burst data is greater than $N_1$, determine the first FEC decoding type corresponding to $N_1$, where $N_1$ is a threshold corresponding to the first FEC decoding type; or when the length of the to-be-decoded data in the burst data is less than or equal to $N_{p-1}$ and is greater than $N_p$, determine the $p^{th}$ FEC decoding type corresponding to $N_p$, where $N_p$ is a threshold corresponding to the $p^{th}$ FEC decoding type, and $N_{p-1}$ is a threshold corresponding to the $p-1^{th}$ FEC decoding type; or when the length of the to-bedecoded data in the burst data is less than or equal to $N_m$ and is greater than 0, determine the $m^{th}$ FEC decoding type corresponding to $N_m$, where $N_m$ is a threshold corresponding to the $m^{th}$ FEC coding type, where m is an integer greater than or equal to 2, p is any integer in a range that is from 2 to m and that includes 2 and m, and $N_{p-1} > N_p$. The decoding module performs one-codeword decoding according to the FEC decoding type determined by the FEC decoding type determining module.

Optionally, the threshold $K_1$ corresponding to the first FEC decoding type, the threshold $K_{p-1}$ corresponding to the $p-1^{th}$ FEC decoding type, the threshold $K_p$ corresponding to the $p^{th}$ FEC decoding type, and the threshold $K_m$ corresponding to the $m^{th}$ FEC decoding type are determined by using a principle that a total length of a parity bit carried in the burst data is the shortest. Optionally, $N_1$ is equal to a value obtained by multiplying $n_2$ by an integer part of a quotient obtained by dividing $t_1$ by $t_2$; $N_{p-1}$ is equal to a value obtained by multiplying $n_p$ by an integer part of a quotient obtained by dividing $t_{p-1}$ by $t_p$; $N_p$ is equal to a value obtained by multiplying $n_{p+1}$ by an integer part of a quotient obtained by dividing $t_p$ by $t_{p+1}$; and $N_m$ is equal to a value obtained by multiplying $n_m$ by an integer part of a quotient obtained by dividing $t_{m-1}$ by $t_m$, where $t_1$, $t_2$, $t_{p-1}$, $t_p$, $t_{m-1}$, and $t_m$ are respectively lengths of one-codeword parity bits of the first FEC coding type, the second FEC coding type, the $p-1^{th}$ FEC coding type, the $p^{th}$ FEC coding type, the $m-1^{th}$ FEC coding type, and the $m^{th}$ FEC coding type; and $n_2$, $n_p$, $n_{p+1}$, and $n_m$ are respectively one-codeword lengths of the second FEC coding type, the $p^{th}$ FEC coding type, the $p+1^{th}$ FEC coding type, and the $m^{th}$ FEC coding type.

Optionally, the decoding device further includes a data length determining module, configured to determine a length of the burst data. The FEC decoding type determining module is specifically configured to: query the correspondence between a data length and an FEC coding type according to the length of the burst data, and determine an FEC decoding type or an FEC decoding type sequence corresponding to the length of the burst data; and the decoding module is specifically configured to perform decoding according to the determined FEC decoding type or FEC decoding type sequence.

In a scenario, the foregoing decoding device may be a device in FIG. 14. Specifically, functions of the FEC decoding type determining module and the decoding module may be implemented by using a processor in FIG. 14. Specifically, a corresponding processing function may be solidified in corresponding hardware, for example, the processor may be specifically represented as a field programmable gate array (FPGA), or may be represented as a corresponding logic array, a digital signal processor (DSP), or the like. The foregoing is only an example, and this embodiment of the present disclosure sets no limitation on a specific component for implementing functions in this embodiment of the present disclosure. In another scenario, optionally, the decoding device shown in FIG. 13 may further include a storage device. The storage device may store corresponding program code, an operating system, and an application program; and the processor is configured to execute the program code in the storage device, and when the program code is executed, the processor may implement the functions of the FEC decoding type determining module and the decoding module. Optionally, the decoding device may further include a receiving device and a sending device, which are respectively configured to receive data and send the data; and a communications interface, configured to perform communication between internal components of the decoding device.

According to the burst data coding device and decoding device, and the corresponding communications system that are provided in this embodiment of the present disclosure, the coding device at a transmit end determines a forward error correction FEC coding type according to a length of to-be-coded data in the burst data, and performs coding according to the determined FEC coding type. The decoding device at a receive end determines a forward error correction FEC decoding type according to a length of to-be-decoded data in received burst data, and performs decoding according to the determined FEC decoding type. The burst data coding device and decoding device, and the corresponding communications system that are provided in this embodiment of the present disclosure support different FEC coding and decoding types. Compared with a single FEC coding and decoding type, a coding and decoding type is flexibly selected according to the data length, thereby reducing a parity bit that needs to be sent, reducing redundancy, and improving utilization of a communication resource. In addition, because the transmit end and the receive end independently select an FEC coding and decoding type according to the data length, a corresponding FEC parameter does not need to be transmitted, thereby reducing a communication resource.

The communications system mentioned in Embodiment 1 and Embodiment 2 of the present disclosure includes the coding device and the decoding device that are provided in Embodiment 2. By using methods provided in Embodiment 1, it is implemented that a transmit end and a receive end independently select an FEC coding and decoding type according to a data length, and FEC coding and decoding can be implemented without a need to transmit a corresponding FEC parameter, thereby reducing a communication resource. Certainly, an FEC decoding type of the decoding device at the receive end is corresponding to an FEC coding type of the coding device at the transmit end. After a coding rule is configured, a length of to-be-coded data, a length of coded data, that is, a length of to-be-decoded data, an FEC coding type, and an FEC decoding type have a one-to-one correspondence. That is, a determined length of the to-be-coded data is corresponding to a determined FEC coding type. The length of the to-be-decoded data formed by performing coding by using the determined FEC coding type is also determined. The determined length of the to-be-decoded data is corresponding to a determined FEC decoding type, and original data can be restored by performing decoding on the to-be-decoded data by using the determined FEC decoding type.

A person of ordinary skill in the art may understand that all or a part of the steps of the method embodiments may be implemented by a program instructing relevant hardware. The program may be stored in a computer readable storage medium. When the program runs, the steps of the method embodiments are performed. The foregoing storage medium includes: any medium that can store program code, such as a ROM, a RAM, a magnetic disk, or an optical disc.

Finally, it should be noted that the foregoing embodiments are merely intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of the present disclosure.

What is claimed is:

1. A method of coding data, wherein the method is implemented by a transmit device and comprises:
    performing one-codeword forward error correction (FEC) coding on to-be-coded data by using a first FEC coding type related to the length of the to-be-coded data;
    when the to-be-coded data is not entirely coded, continually performing one-codeword FEC coding on the remaining to-be-coded data by using a second FEC coding type related to the length of the remaining to-be-coded data, wherein a length of parity bits of the first FEC coding type is longer than a length of parity bits of the second FEC coding type; and
    sending coded data to a receive device.

2. The method according to claim 1, wherein the first FEC coding type is selected according to a length of the to-be-coded data and a correspondence between a data length and a FEC coding type.

3. The method according to claim 1, wherein the second FEC coding type is selected according to a length of remaining to-be-coded data after the performed one-codeword FEC coding and a correspondence between a data length and a FEC coding type.

4. The method according to claim 1, wherein the first FEC coding type comprises at least one of a shortened LDPC (16200, 14400) code and a full LDPC (16200, 14400) code.

5. The method according to claim 4, wherein the performing one-codeword FEC coding on the to-be-coded data according to a first FEC coding type comprising:
    performing one-codeword coding on the to-be-coded data by using the full LDPC (16200, 14400) code if the length of the to-be-coded data is greater than 14400; and
    performing one-codeword coding on the to-be-coded data by using the shortened LDPC (16200, 14400) code if the length of the to-be-coded data is less than or equal to 14400 and is greater than 10080.

6. The method according to claim 1, wherein the second FEC coding type comprises at least one of a shortened LDPC (5940, 5040) code and a full LDPC (5940, 5040) code.

7. A method of decoding data, wherein the method is implemented by a receive device and comprises:
    receiving data from a transmit device; and
    decoding the data by:
    performing one-codeword forward error correction (FEC) decoding on to-be-decoded data by using a first FEC decoding type related to the length of the to-be-decoded data,
    when the to-be-decoded data is not entirely decoded, continually performing one-codeword FEC decoding on the remaining to-be-decoded data by using a second FEC decoding type related to the length of the remaining to-be-decoded data, wherein a length of parity bits of the first FEC decoding type is longer than a length of parity bits of the second FEC decoding type.

8. The method according to claim 7, wherein the first FEC decoding type is selected according to a length of the to-be-coded data and a correspondence between a data length and a FEC decoding type.

9. The method according to claim 7, wherein the second FEC decoding type is selected according to a length of remaining to-be-coded data after the performed one-codeword FEC decoding and a correspondence between a data length and a FEC decoding type.

10. The method according to claim 7, wherein the first FEC decoding type comprises at least one of a shortened LDPC (16200, 14400) code and a full LDPC (16200, 14400) code.

11. The method according to claim 7, wherein the second FEC decoding type comprises at least one of a shortened LDPC (5940, 5040) code and a full LDPC (5940, 5040) code.

12. A device for coding data, comprising
    a processor, a memory, a sending device, and a communications interface, wherein the memory stores instructions for implementing a coding method, and the processor is connected to both the memory and the sending device through the communications interface; and
    when the processor invokes the instructions in the memory, the following steps are executed:
    performing one-codeword forward error correction (FEC) coding on to-be-coded data by using a first FEC coding type related to the length of the to-be-coded data; and,
    when the to-be-coded data is not entirely coded, continually performing one-codeword FEC coding on the remaining to-be-coded data by using a second FEC coding type related to the length of the remaining to-be-coded data, wherein a length of parity bits of the first FEC coding type is longer than a length of parity bits of the second FEC coding type;
    wherein sending device sends coded data to a receive device.

13. The device according to claim 12, wherein the first FEC coding type is selected according to a length of the to-be-coded data and a correspondence between a data length and a FEC coding type.

14. The device according to claim 12, wherein the second FEC coding type is selected according to a length of remaining to-be-coded data after the performed one-codeword FEC coding and a correspondence between a data length and a FEC coding type.

15. The device according to claim 12, wherein the first FEC coding type comprises at least one of a shortened LDPC (16200, 14400) code and a full LDPC (16200, 14400) code.

16. The device according to claim 12, wherein the second FEC coding type comprises at least one of a shortened LDPC (5940, 5040) code and a full LDPC (5940, 5040) code.

17. A device for decoding data, wherein the decoding device comprises:
    a receiving device that receives data;
    a processor, a memory, and a communications interface, wherein the memory stores instructions for implementing a decoding method, and the processor is connected to both the memory and the receiving device through the communications interface; and
    when the processor invokes the instructions in the memory, the following steps are executed:
    performing one-codeword forward error correction (FEC) decoding on to-be-decoded data by using a first FEC decoding type related to the length of the to-be-decoded data, and,
    when the to-be-decoded data is not entirely decoded, continually performing one-codeword FEC decoding on the remaining to-be-decoded data by using a second FEC decoding type related to the length of the remaining to-be-decoded data, wherein a length of parity bits of the first FEC decoding type is longer than a length of parity bits of the second FEC decoding type.

18. The device according to claim 17, wherein the first FEC decoding type is selected according to a length of the to-be-coded data and a correspondence between a data length and a FEC decoding type.

19. The device according to claim 17, wherein the second FEC decoding type is selected according to a length of remaining to-be-coded data after the performed one-codeword FEC decoding and a correspondence between a data length and a FEC decoding type.

20. The device according to claim 17, wherein the first FEC decoding type comprises at least one of a shortened LDPC (16200, 14400) code and a full LDPC (16200, 14400) code.

21. The device according to claim 17, wherein the second FEC decoding type comprises at least one of a shortened LDPC (5940, 5040) code and a full LDPC (5940, 5040) code.

* * * * *

UNITED STATES PATENT AND TRADEMARK OFFICE
CERTIFICATE OF CORRECTION

PATENT NO. : 10,476,526 B2
APPLICATION NO. : 15/990180
DATED : November 12, 2019
INVENTOR(S) : Si et al.

Page 1 of 1

It is certified that error appears in the above-identified patent and that said Letters Patent is hereby corrected as shown below:

In the Claims

Claim 5, Column 25, Line 39: "14400and" should read -- 14400 and --.

Signed and Sealed this
Twenty-first Day of July, 2020

Andrei Iancu
*Director of the United States Patent and Trademark Office*